United States Patent
Aoki et al.

(12) 
(10) Patent No.: US 6,890,864 B2
(45) Date of Patent: May 10, 2005

(54) SEMICONDUCTOR DEVICE FABRICATING METHOD AND TREATING LIQUID

(75) Inventors: Hidemitsu Aoki, Kanagawa (JP);
Kenichi Nakabeppu, Kanagawa (JP);
Hiroaki Tomimori, Kanagawa (JP);
Toshiyuki Takewaki, Kanagawa (JP);
Nobuo Hironaga, Kanagawa (JP);
Hiroyuki Kunishima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 68 days.

(21) Appl. No.: 10/339,658

(22) Filed: Jan. 10, 2003

(65) Prior Publication Data

US 2003/0134507 A1 Jul. 17, 2003

Related U.S. Application Data

(63) Continuation-in-part of application No. 10/191,531, filed on Jul. 10, 2002, now abandoned.

(30) Foreign Application Priority Data

Jul. 12, 2001 (JP) ........................................ 2001-212191
Jul. 5, 2002 (JP) ........................................ 2002-197948

(51) Int. Cl.$^7$ ........................ H01L 21/302; H01L 21/31
(52) U.S. Cl. ...................... 438/745; 438/700; 438/725; 438/738
(58) Field of Search .................................. 438/700, 709, 438/725, 738, 745, 748

(56) References Cited

U.S. PATENT DOCUMENTS

| | | | |
|---|---|---|---|
| 4,356,374 A | 10/1982 | Noyori et al. | 438/118 |
| 4,969,029 A * | 11/1990 | Ando et al. | 438/129 |
| 5,885,901 A | 3/1999 | Gotoh et al. | 438/720 |
| 6,099,677 A * | 8/2000 | Logothetis et al. | 156/253 |
| 6,117,795 A | 9/2000 | Pasch | 438/745 |
| 6,245,155 B1 | 6/2001 | Leon et al. | 134/3 |
| 6,410,436 B2 * | 6/2002 | Yamagata et al. | 438/689 |

* cited by examiner

Primary Examiner—Ha Tran Nguyen
(74) Attorney, Agent, or Firm—McGinn & Gibb, PLLC

(57) ABSTRACT

There are provided a semiconductor device fabricating method for forming a wiring layer on a semiconductor substrate, followed by cleaning, which may prevent elution and oxidation of the wiring layer, and a treating liquid used in the fabricating method. A Cu wiring, an interlayer film over the Cu wiring and an opening in the interlyaer film to expose the surface of the Cu wiring are formed in a plasma atmosphere. IPA is sprayed to the semiconductor device, and then, an organic release process is performed thereto with an amine solvent to remove an etching residue. The semiconductor device is rinsed with the IPA again to remove the remaining amine, and then is cleaned with a treating liquid, which is alkalescent. Then, it is rinsed with pure water or $CO_2$ water and is dried.

27 Claims, 19 Drawing Sheets

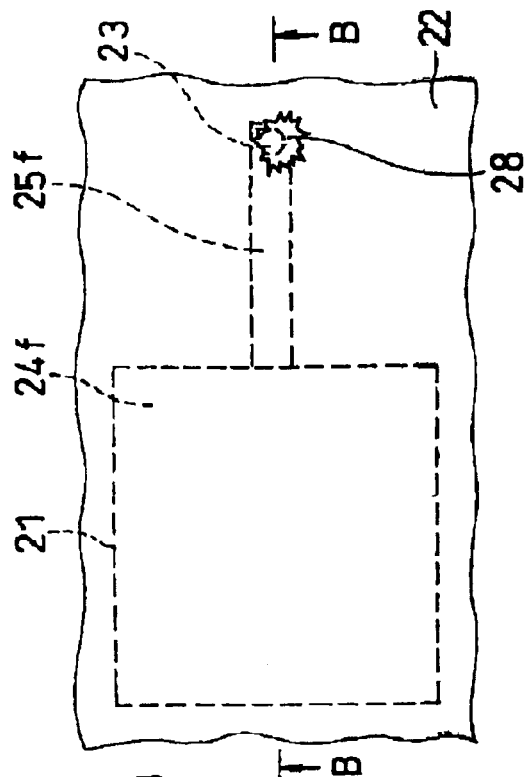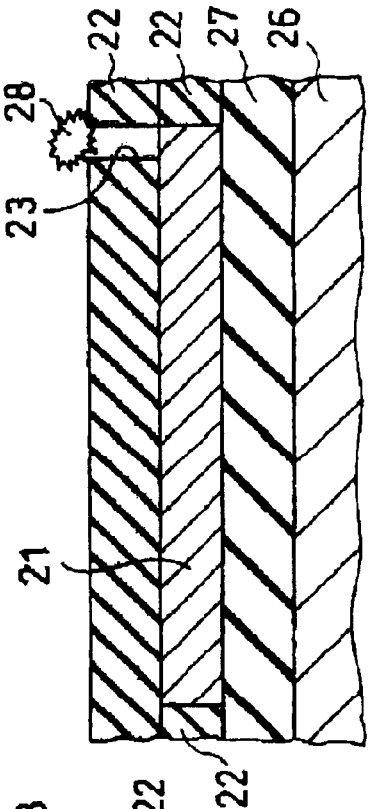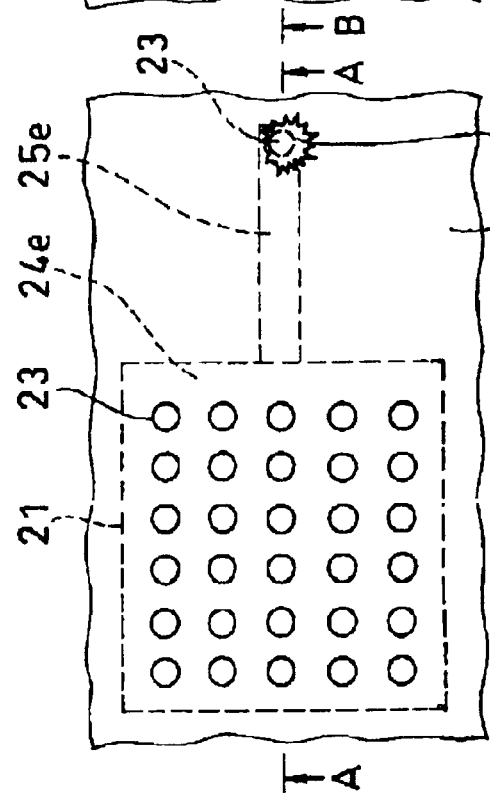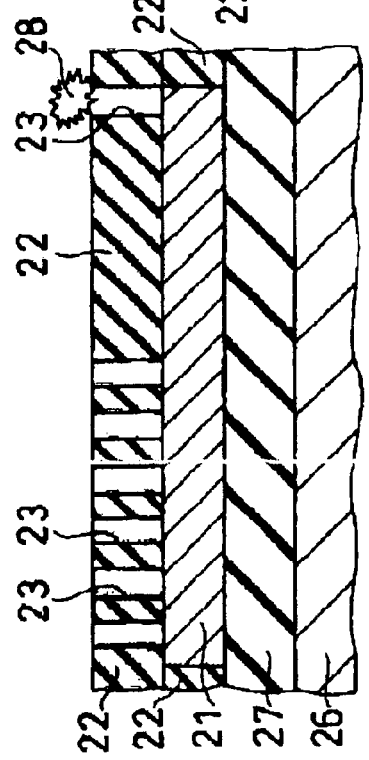
FIG. 3A
FIG. 3B
FIG. 3C
FIG. 3D

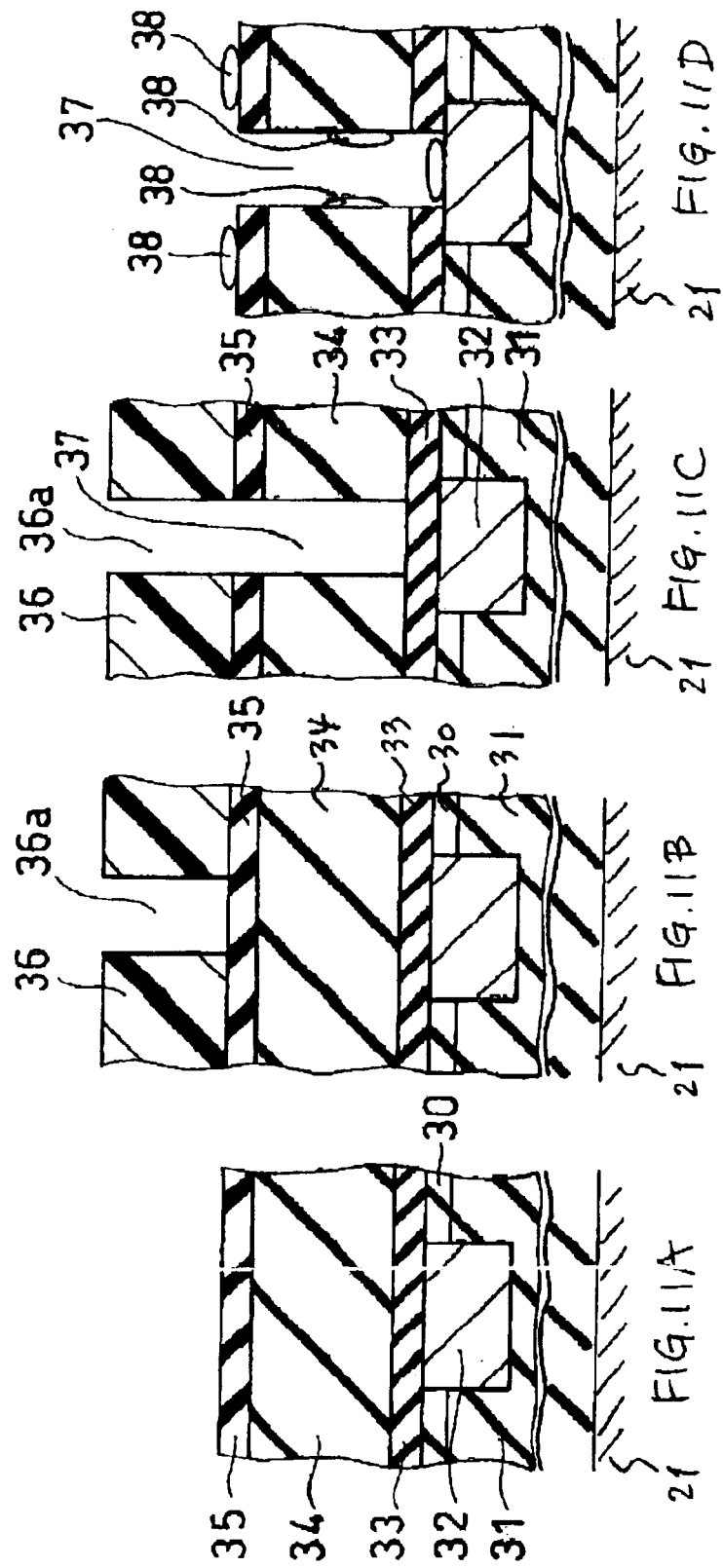

SEMICONDUCTOR DEVICE FABRICATING METHOD AND TREATING LIQUID

The present application is a Continuation-In-Part (CIP) application of U.S. patent application Ser. No. 10/191,531, filed on Jul. 10, 2002 now abandoned.

BACKGROUND OF THE INVENTION

1. Field of the Invention

The present invention relates to a semiconductor device fabricating method including a process for forming a wiring layer, an interlayer film and an opening and a process for cleaning the opening and a treating liquid used in cleaning of the opening. More specifically, the present invention relates to a semiconductor device fabricating method which may prevent elusion and oxidation of the Wiring layer in a cleaning process after forming at least one of the interlayer film and the opening under a plasma atmosphere and a treating liquid used in cleaning of the opening. The present application is based on Japanese Application No. 2001-212191 and No. 2002-197948, which is incorporated herein by reference.

2. Description of the Related Art

A semiconductor device is fabricated by forming on a semiconductor substrate an interlayer film, a wiring layer made of metal such as Cu, and an opening of the interlayer film by methods such as sputtering, dry etching and plasma ashing. Thereafter, the semiconductor device is cleaned with an organic release liquid to remove contamination such as an etching residue produced when the interlayer film, the wiring layer and the opening are formed. For example, an amine release liquid is used as the organic release liquid.

This will be described by using a flowchart showing a semiconductor device cleaning method with the organic release liquid shown in FIG. 22. FIG. 22 shows a process for forming a via in an interlayer film on a wiring made of Cu (hereinafter, referred to as a Cu wiring), which is reaching the Cu wiring to fabricate a semiconductor device, followed by a semiconductor device cleaning process. As shown in step S51 of FIG. 25, the via reaching the Cu wiring is formed in an interlayer film on the Cu wiring by dry etching. Thereafter, the semiconductor device is cleaned in the process shown in steps S52 to S55.

As shown in step S52, an organic release process is performed with an amine solvent to remove an etching residue produced in step S51. At this time, under conditions of the organic release process, for example, the temperature is 70° C. and time is 10 minutes. As shown in step S53, the semiconductor device is rinsed with pure water or $CO_2$ gas-containing water (hereinafter, referred to as $CO_2$ water). At this time, rinse conditions are 15 minutes at room temperature. As shown in step S54, the semiconductor device is dried. The semiconductor device is dried by jetting heated N2 gas to the semiconductor device for 10 minutes.

The inventors of the present invention, however, have revealed that washing steps cause problems as described below. In rinsing with the pure water or $CO_2$ water (hereinafter, generically referred to as pure water) shown in step S53 of FIG. 22, the Cu wiring exposed into the via is eluted into the pure water or $CO_2$ water. Otherwise, after drying, the Cu wiring in the via is easily oxidized. The present invention has been made in view of such problems and the present invention is a semiconductor device fabricating method including a process for forming a wiring layer on a semiconductor substrate, followed by cleaning, which may prevent elution and oxidation of the wiring layer, and a treating liquid used in this fabricating method.

SUMMARY OF THE INVENTION

In the method of fabricating the semiconductor device according to the first aspect of the present invention, a wiring layer is formed on a semiconductor substrate, and an interlayer film is formed on the wiring layer and an opening are formed in the interlayer film to expose the wiring layer, and then, the opening is cleaned with a nonaqueous solvent. Either the interlayer film or the opening is formed under a plasma atmosphere or both the interlayer film or the opening are formed under the plasma atmosphere.

According to the first aspect of the present invention, after an interlayer film or an opening is formed on a semiconductor substrate under a plasma atmosphere, the opening is cleaned with a nonaqueous solvent. Electric charges accumulated onto the interlayer film in the plasma atmosphere are moved to the nonaqueous solvent side, which can be then removed from the interlayer film. When rinsing the semiconductor device with water in the later process, the metal constructing the wiring layer can be prevented from being ionized to be eluted or oxidized. The water is, for example, pure water or $CO_2$ water. There is also DIW (deionized water) as the pure water.

According to the second aspect of the present invention, after the process for forming the opening, cleaning the opening with a treating liquid containing an anticorrosive is performed. This can form a corrosion-resistant film on the wiring layer exposed in the opening. As a result, when rinsing the semiconductor substrate with water in the later process, the metal constructing the wiring layer can be further prevented from being ionized to be eluted or oxidized. The treating liquid may be composed by adding an anticorrosive to the nonaqueous solvent.

Further, after the process for cleaning the opening with the nonaqueous solvent, the present invention may have a process for cleaning the opening with pure water or carbonated water. This can prevent the nonaqueous solvent from remaining in the opening.

Further, the semiconductor substrate may be a silicon wafer. The present invention may have a process for revolving the silicon wafer at a speed of 500 rpm (revolutions per minute) and for jetting the nonaqueous solvent to the silicon water as the process for cleaning the opening with the nonaqueous solvent. Depositions on the silicon wafer are shaken off by a centrifugal force to be removed from the surface of the silicon wafer. As a result, the semiconductor device is formed by a process for cleaning with the nonaqueous solvent without a process for cleaning with a water. The metal constructing the wiring layer can be further prevented from being ionized to be eluted or oxidized. When the silicon wafer is revolved at a speed which is lower than 500 rpm, the centrifugal force is not enough to shake the depositions off from the silicon wafer. More preferably, the silicon wafer is revolved at a speed which is higher than 1000 rpm.

Further, the present invention may have a process for providing the nonaqueous solvent to the exposed part of the wiring layer so as to remove electric charges accumulated onto the interlayer film.

Further, the present invention may have a process for jetting the nonaqueous solvent to the silicon wafer, and then jetting an air to the silicon wafer a few times as the process for cleaning the opening with the nonaqueous solvent. The opening can be further cleaned, and stains remaining on the silicon wafer can be further prevented after drying the silicon wafer.

A treating liquid according to the third aspect of the present invention cleans an opening. After an interlayer film is formed on the wiring layer on a semiconductor substrate, the opening exposing the wiring layer is formed in the interlayer film. The treating liquid contains an anticorrosive.

According to the fourth aspect of the present invention, a treating liquid contains an anticorrosive. An opening is cleaned with the treating liquid to form a corrosion-resistant film on a wiring layer. As a result, when rinsing the semiconductor device with water in the later process, the metal constructing the wiring layer can be prevented from being ionized to be eluted or oxidized. The treating liquid may be composed by adding an anticorrosive to the nonaqueous solvent.

In addition, preferably, the treating liquid has a composition containing benztriazole: 0.5 to 30% by mass, amine: 0.0005 to 1% by mass, water: 0.1 to 5% by mass, and the remainder of isopropyl alcohol and unavoidable impurities, and is alkaline. This can form a more stable corrosion-resistant film on the wiring layer.

BRIEF DESCRIPTION OF THE DRAWINGS

Features of the illustrative, non-limiting embodiments of the present invention will be more apparent from the following description taken in conjunction with the accompanying drawings, in which:

FIG. 3A is a schematic plan view showing a semiconductor device having a large number of vias reaching a large-area wiring region;

FIG. 3B is a schematic cross-sectional view cutting the semiconductor device along a line A—A of FIG. 3A;

FIG. 3C is a schematic plane view showing a semiconductor device having a small number of vias reaching the large-area wiring region;

FIG. 3D is a schematic cross-sectional view cutting the semiconductor device along B—B of FIG. 3C;

FIGS. 11A to 11D are schematic cross-sectional views showing the semiconductor device fabricating method according to the second embodiment in that process order;

FIGS. 16A and 16B are graphs using the position of a sample (wafer) surface to enter the horizontal axis and the potential to enter the vertical axis to show the potential distribution measuring results of the sample in which FIG. 16A shows the potential distribution of the sample before an IPA spray process and FIG. 16B shows the potential distribution of the sample after the IPA spray process;

DETAILED DESCRIPTION OF THE EMBODIMENTS

Figures 1A, 1B:
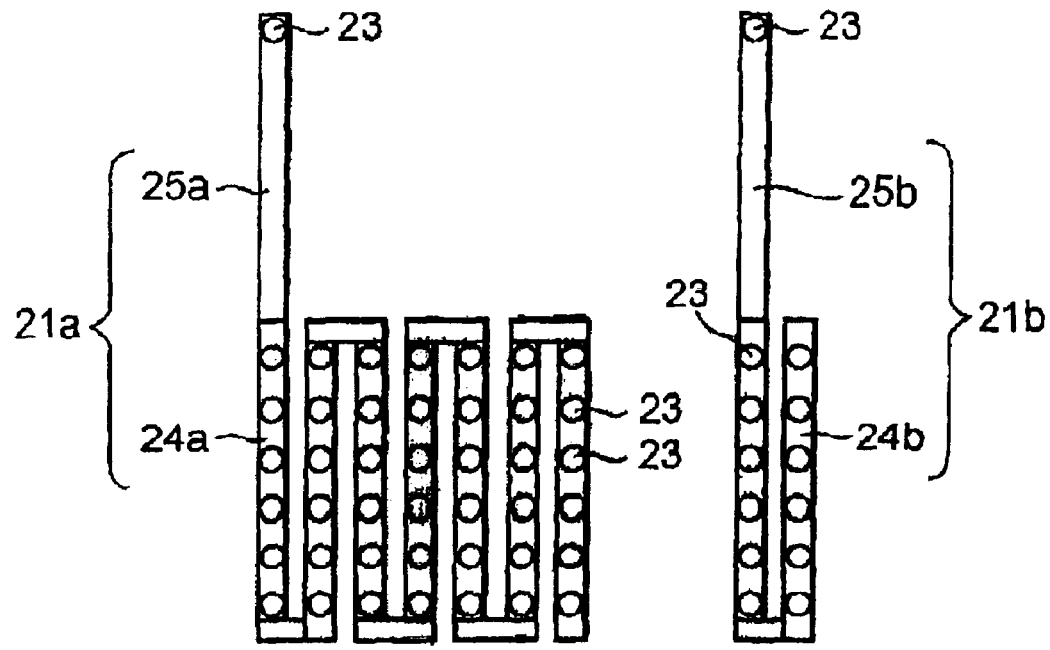
FIGS. 1A to 1D are schematic plan views showing shapes of wiring layers.

The inventors of the present invention have earnestly conducted experiment and research to solve the foregoing problems and have obtained the following findings about why metal constructing an exposed wiring layer is easily eluted or oxidized when cleaning a semiconductor device with pure water and the like. Specifically, in a process for forming an interlayer film, a wiring layer and a via opening on a semiconductor substrate, methods using plasma, such as sputtering, plasma CVD, dry etching and plasma ashing, are performed. In these processes, the semiconductor substrate and the wiring layer and the interlayer film formed on the semiconductor substrate (hereinafter, referred to as a semiconductor device) are exposed to plasma. This accumulates electric charges onto the interlayer film as an insulating film for charge-up. The electric charges are discharged all at once when the wiring layer and pure water (pure water or $CO_2$ water) are contacted with each other. Then, the metal forming the wiring layer is ionized and eluted. Otherwise, after drying, the metal forming the wiring layer is easily oxidized. Furthermore, in a semiconductor device cleaning process, an organic release process is performed with an amine solvent. When a native oxide film formed on the surface of the wiring layer, for example, a CuOx film when the wiring layer is formed by Cu, is removed, whereby the metal constructing the wiring layer is eluted more easily.

More detailed description will be made on the semiconductor device including the wiring layer and an interlayer film over the wiring layer. The wiring layer includes a large-area wiring region and a drawing wiring region having a relatively small area drawn from the large-area wiring region. In this case, when the large-area wiring region is large, the metal constructing the wiring layer is more likely to eluted from the via formed in the drawing wiring region. In addition, when the wiring layer is not connected to the semiconductor substrate and is in a floating state, the phenomenon more easily occurs.

Further, the metal constructing the wiring layer is eluted based on the number of vias formed in the interlayer film to reach the surface of the wiring layer. When the number of the vias is less than a predetermined number, the larger the number of the vias is, the less the matal constructing the wiring layer is eluted from one via formed at the drawing wiring region. It is considered that the wiring layers and the interlayer film constitute a capacitor and that electric charges are accumulated in the capacitor. When the number of the vias is large, electric charges to be discharged are distributed among every via. However, when the number of the vias is more than the predetermined number, the larger the number of the vias is, the more the metal, for example Cu, constructing the wiring layer is eluted from one via formed at the drawing wiring region. This is because electric charges are more accumulated into the interlayer film from the plasma used at the process form forming vias. For example, when the number of the vias formed in the wiring layer in the floating state is below 100, the phenomenon is not significant. On the other hand, when the number of the vias is above 1000, the phenomenon easily occurs. When the wiring layer exposed in the via is eluted and oxidized, the connection state between the wiring layer and the conductive material buried in the via is deteriorated to lower the reliability of the semiconductor device.

Figures 1C, 1D:
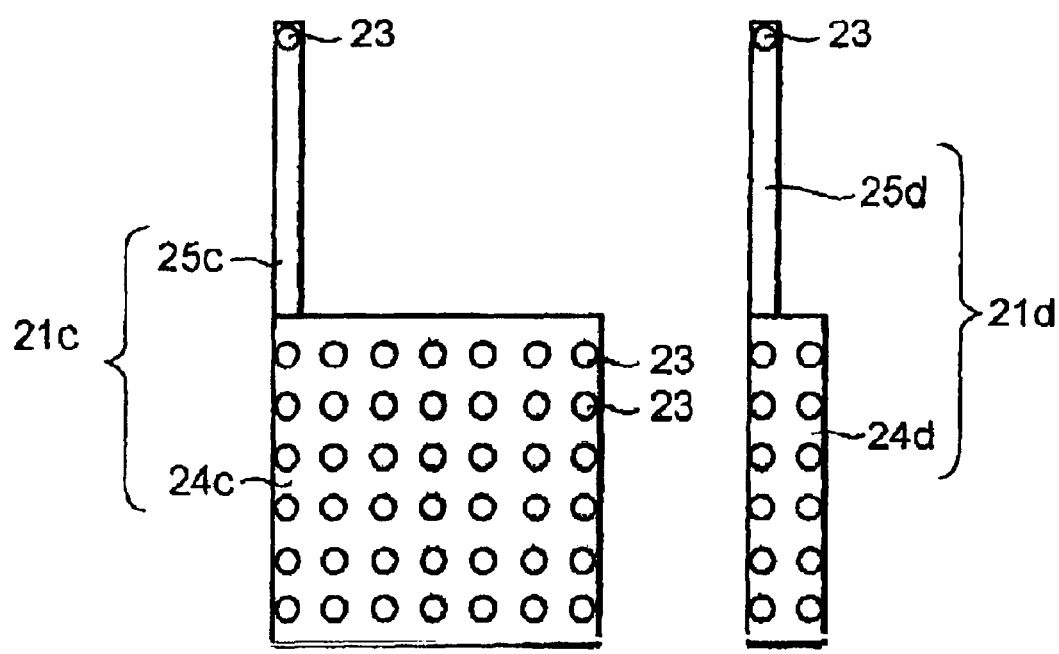

FIGS. 1A to 1D are schematic plan views showing shapes of wiring layers in semiconductor devices. FIGS. 1A to 1B show the wiring layers having a chain-like shape. FIGS. 1C and 1D show the wiring layers having a pad-like shape. As shown in FIG. 1A, a wiring layer 21a made of Cu has a large-area wiring region 24a and a drawing wiring region 25a connected to the large-area wiring region 24a. The area of the large-area wiring region 24a is larger than that of the drawing wiring region 25a. In the semiconductor device as an example, the large-area wiring region 24a is formed with above 100 vias 23, for example, 10000 vias 23, and the large-area wiring region 24a has the wiring layer 21a of a single-line chain shape, and a large number of the vias 23 formed in the interlayer film on the wiring and reaching the wiring layer 21a. The drawing wiring region 25a has a relatively small number of the vias 23, for example, one via 23 formed in the interlayer film and reaching the wiring layer 25a. The number of the vias 23 formed in the drawing wiring region 25a is below 1/100 of the number of the vias 23 formed in the large-area wiring region 24a. The total area of the openings of the vias 23 formed in the drawing wiring region 25a is below 1/100 of the total area of the openings of the vias 23 formed in the large-area wiring region 24a. In the wiring layer 21a shown in FIG. 1A, the number of the vias 23 on the large-area wiring region 24a is so large that the area which is exposed to a plasma atmosphere is also large. Therefore, electric charges are easily accumulated in the large-area wiring region 24a during the process under a plasma atmosphere. The number of the vias 23 formed in the drawing wiring region 25a is smaller than the number of the vias 23 formed in the large-area wiring region 24a. Thus, electric charges are easily discharged concentratedly from the vias 23 formed in the drawing wiring region 25a. The metal (Cu) constructing the wiring layer 21a is easily eluted from the wiring layer 21a exposed into the via 23 formed in the drawing wiring region 25a.

On the contrary, in FIG. 1B, the number of the vias 23 formed in a large-area wiring region 24b is below 100, for example, 20. The number of the vias 23 formed in a drawing wiring region 25b is more than 1/100 of the number of the vias 23 formed in the large-area wiring region 24b. The total area of the openings of the vias 23 formed in the drawing wiring region 25b is larger than 1/100 of the total area of the openings of the vias 23 formed in the large-area wiring region 24b. In a wiring layer 21b shown in FIG. 1B, metal elution in the drawing wiring region 25b is hard to occur.

In a wiring layer 21c shown in FIG. 1C, a large-area wiring region 24c has a pad shape. The area of the large-area wiring region 24c is larger than that of a drawing wiring region 25c. The large-area wiring region 24c is formed with above 100 vias 23, for example, 10000 vias 23. The large-area wiring region 24c is of a plane shape and has the wiring layer 21c and a large number of the vias 23 formed in the interlayer film over the wiring layer 21c and reaching the wiring layer 21c. The drawing wiring region 25c has a relatively small number of the vias 23, for example, one via 23 formed in the interlayer film over the drawing wiring region 25c. The number of the vias 23 formed in the drawing wiring region 25c is below 1/100 of the number of the vias 23 formed in the large-area wiring region 24c. The total area of the openings of the vias 23 formed in the drawing wiring region 25c is below 1/100 of the total area of the openings of the vias 23 formed in the large-area wiring region 24c. Therefore, in the wiring layer 21c shown in FIG. 1C, metal constructing the wiring layer 21c is easily eluted from the via 23 formed in the drawing wiring region 25c.

In a wiring layer 21d shown in FIG. 1D, the number of the vias 23 formed in a large-area wiring region 24d having a pad-like shape is below 100, for example, 20. The number of the vias 23 formed in a drawing wiring region 25d is larger than 1/100 of the number of the vias 23 formed in the large-area wiring region 24d. The total area of the openings of the vias 23 formed in the drawing wiring region 25d is larger than 1/100 of the total area of the openings of the vias 23 formed in the large-area wiring region 24d. Metal elution in the drawing wiring region 25d is hard to occur.

Figure 2:
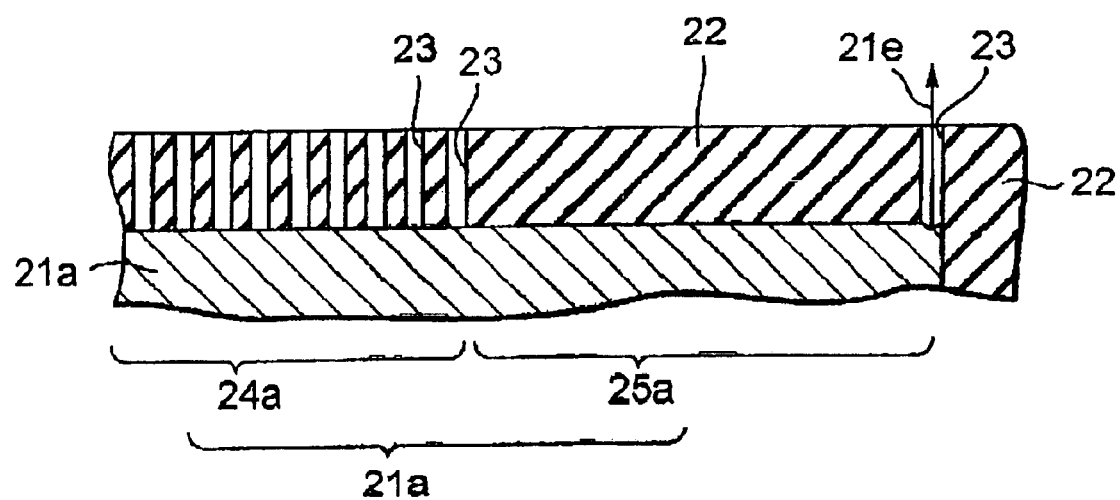
FIG. 2 is a schematic cross-sectional view showing the melting behavior of the wiring layer.

FIG. 2 is a cross-sectional view showing the melting behavior of the wiring layer. The wiring layer shown in FIG. 2 is the same as the wiring layer shown in FIG. 1A. As shown in FIG. 2, a wiring layer 21a made of Cu is provided on a semiconductor substrate, not shown. An interlayer film 22 is provided so as to bury the top and sides of the wiring layer 21a. The wiring layer 21a has a large-area wiring region 24a and a drawing wiring region 25a connected to the large-area wiring region 24a. The number of the vias 23 formed in the large-area wiring region 24a is above 100 times larger than the number of the vias 23 formed in the drawing wiring region 25a. When the semiconductor device is rinsed with pure water (pure water or $CO_2$ water), the metal Cu constructing the wiring layer 21a is eluted from the via 23 formed in the drawing wiring region 25a. The Cu elution is indicated by arrow 21e.

FIG. 3A is a schematic plane view showing a semiconductor device having a large number of vias on the large-area wiring region. FIG. 3B is a schematic cross-sectional view cutting the semiconductor device along a line A—A of FIG. 3A. FIG. 3C is a schematic plane view showing a semiconductor device having a small number of vias on the large-area wiring region. FIG. 3D is a schematic cross-sectional view cutting a semiconductor device along B—B of FIG. 3C. In FIGS. 3A to 3D, elution of metal constructing the wiring layer is shown as elution metal 28.

In the semiconductor device shown in FIGS. 3A to 3D, an interlayer film 27, a wiring layer 21, and an interlayer film 22 are formed on a silicon substrate 26 in this order. In the interlayer film 22 corresponding to the large-are wiring region 24e, a large number of vias 23 are formed. In the interlayer film 22 corresponding to the drawing wiring region 25e, one via 23 is formed. IN the semiconductor device shown in FIGS. 3C and 3D, the interlayer film 27, the wiring layer 21, and the interlyaer film 22 are formed on the silicon substrate 26 in this order. In the interlayer film 22 corresponding to the large-area wiring region 24f, no via is formed. In the interlayer film 22 corresponding to the drawing wiring region 25f, one via 23 is formed. As described above, metal elution from vias depends on an area of the wiring. The larger the area of the wiring is, the larger the metal elution of the wiring.

Further, the metal elution from the vias depends on the number of vias at a pad area. There is the threshold number of vias which make an amount of metal elution minimum. As shown in FIGS. 3A and 3B, although the number of vias is smaller than the threshold number, metal elution occurs. On the other hand, as shown in FIGS. 3C and 3D, although the number of vias is larger than the threshold number, metal elution occurs.

In the semiconductor device fabricating process according to the present invention, a wiring layer and an interlayer film are formed. Then, an opening are formed in the interlayer film under a plasma atmosphere. And then, the opening is cleaned with a nonaqueous solvent such as IPA. This moves electric charges accumulated onto the interlayer film to the nonaqueous solvent side so as to perform neutralization without eluting the wiring layer. More preferably, before the opening is rinsed with pure water, the opening is cleaned with a treating liquid containing an anticorrosive to form a corrosion-resistant film in the exposed part of the wiring layer. This can prevent the wiring layer from being eluted.

Figure 4:
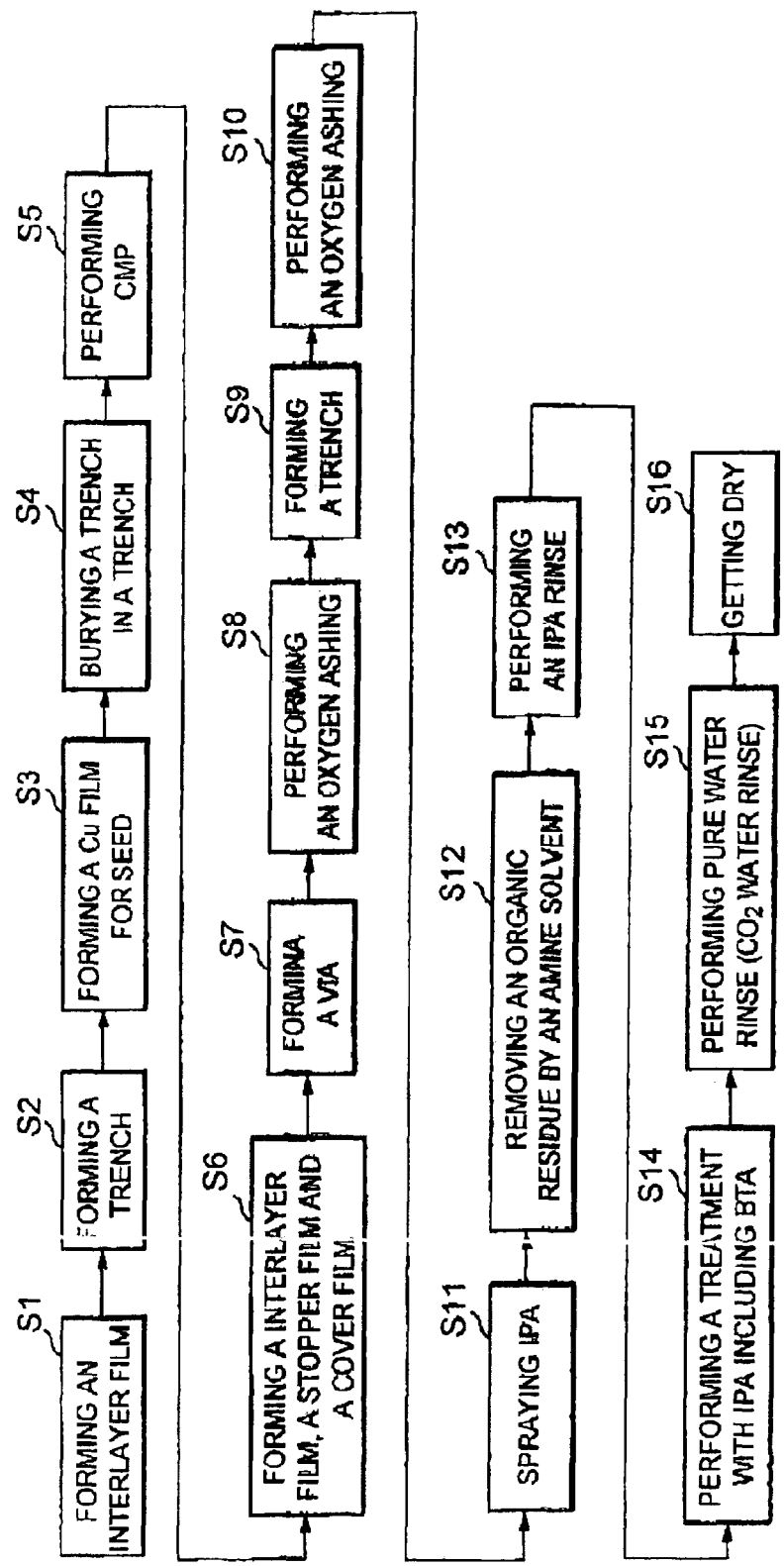
FIG. 4 is a flowchart showing a semiconductor device fabricating method with an organic release liquid according to a first embodiment of the present invention.

An embodiment of the present invention will be described. FIG. 4 is a flowchart showing a semiconductor device fabricating method with an organic release liquid according to the first embodiment. FIGS. 5A to 5D, FIGS. 6A to 6D, FIGS. 7A and 7B, FIGS. 8A to 8C and FIGS. 9A to 9C are cross-sectional views showing the semiconductor device fabricating method according to the first embodiment in that process order. FIGS. 5A to 5D, FIGS. 6A to 6D and FIGS. 7A and 7B show the wiring fabricating processes by a dual damascene method. FIGS. 8A to 8C and FIG. 9A show cleaning processes after the wiring fabricating process. FIGS. 9B and 9C show barrier metal forming processes.

Figure 5D:
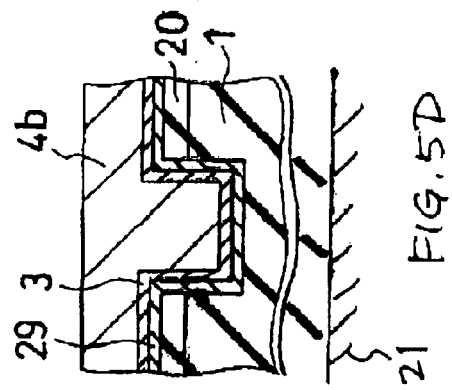
FIGS. 5A to 5D are schematic cross-sectional views showing the semiconductor device fabricating method according to the first embodiment in that process order.
Figure 5C:
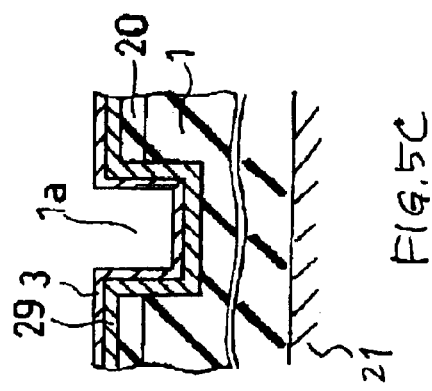
Figure 5B:
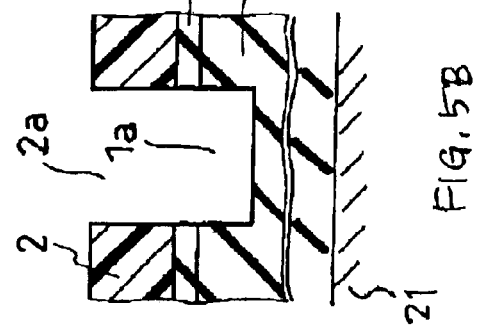
Figure 5A:
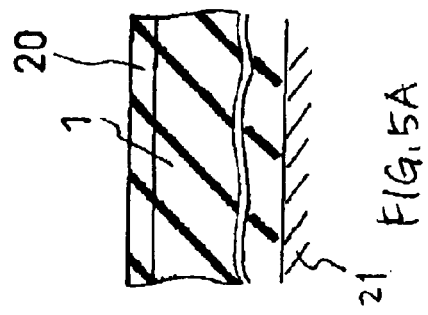

As shown in step S1 of FIG. 4 and FIG. 5A, an interlayer film 1 is formed on a-semiconductor substrate 21 in a plasma atmosphere. At this time, electric charges may be accumulated onto the interlayer film 1 by plasma. The interlayer film 1 is made of, for example, a low-dielectric-constant film (Low-K film) or an $SiO_2$ film deposited by a plasma method. The low-dielectric-constant film refers to a film whose relative dielectric constant is less than 4 of the relative dielectric constant of $SiO_2$. In the embodiment, the relative dielectric constant of the low-dielectric-constant film is 1.0 to 4.0. As the low-dielectric-constant film, there are an inorganic film, an organic film, an organic and inorganic-mixed film, and a porous film thereof. When the interlayer film 1 is the low-dielectric-constant film (Low-K film), a cover film 20 is deposited on the interlayer film 1 by a plasma deposition method or a coating deposition method. The cover film 20 is made of, for example, $SiO_2$ or SiN. When the interlayer film 1 is not the low-dielectric-constant film but is an $SiO_2$ film, the cover film 20 is unnecessary.

As shown in step S2 of FIG. 4 and FIG. 5B, a resist 2 having an opening 2a is formed on the cover film 20. The cover film 20 and the interlayer film 1 are dry etched with the resist 2 as a mask to form a channel 1a in the interlayer film 1. The channel 1a will be used as a trench for a wiring 4. Electric charges may be accumulated onto the interlayer film 1 by the dry etching. The opening 2a of the resist 2 is provided in a region to form the channel 1a in the interlayer film 1. Thereafter, the resist 2 is removed.

As shown in step S3 of FIG. 4 and FIG. 5C, a barrier film 29 comprising a Ta film and a TaN film is formed on the cover film 20 and on the inner wall of the channel 1a by an ionizing sputtering method. And then, a Cu film 3 for seed is deposited on the barrier film 29 by an ionizing sputtering method. Also in the process, electric charges may be accumulated onto the interlayer film 1 by plasma. Thereafter, as shown in step S4 of FIG. 4 and FIG. 5D, a Cu film 4b is formed on the Cu film 3 for seed by the plating method.

Figure 6D:
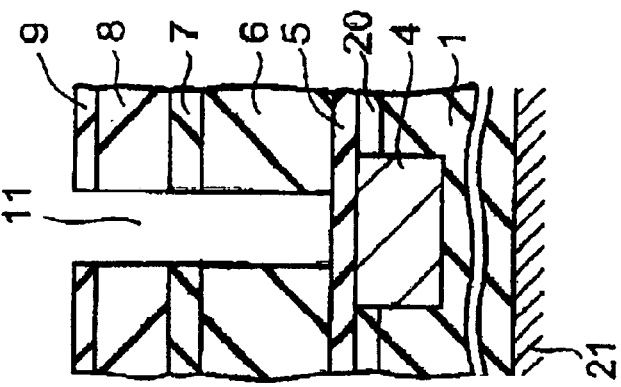
FIGS. 6A to 6D are schematic cross-sectional views showing the semiconductor device fabricating method according to the first embodiment in that process order and show the next processes of FIGS. 5A to 5D.
Figure 6C:
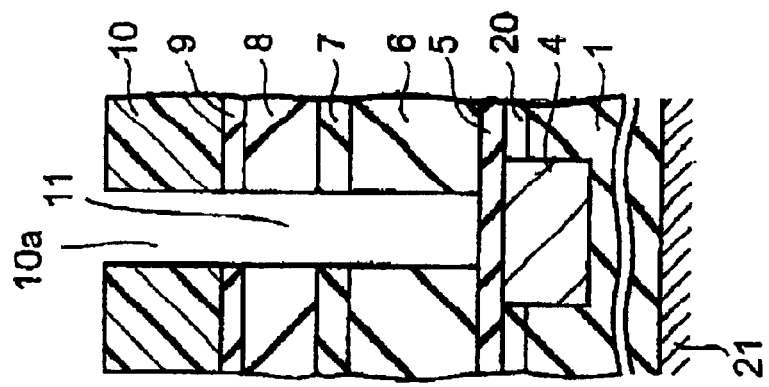
Figure 6B:
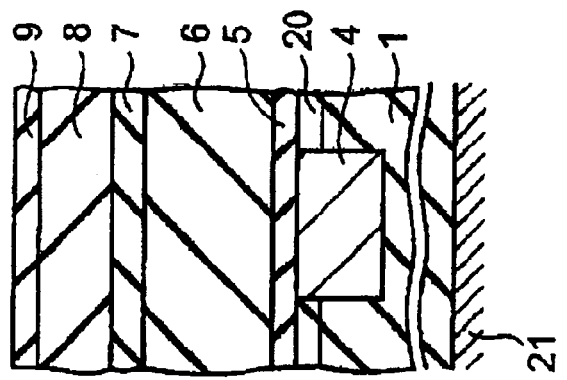
Figure 6A:
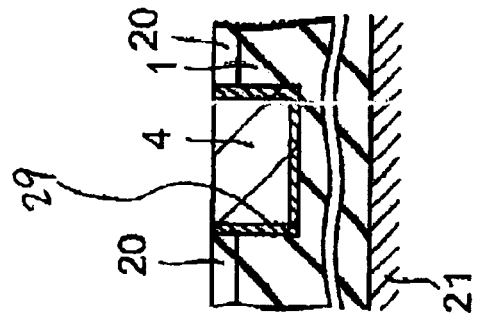

As shown in step S5 of FIG. 4 and FIG. 6A, CMP (Chemical Mechanical Polishing) is conducted to the Cu film 4b to remove the Cu film 4b deposited onto a part other than the inside of the channel 1a. This forms a Cu wiring 4 in the channel 1a. The wiring may be formed by Ag, or Ag or Cu alloy. As shown in step S6 of FIG. 4 and FIG. 6B, a stopper film 5, an interlayer film 6, a stopper film 7, an interlayer film 8 and a cover film 9 are deposited in that order on the cover film 20 and the Cu wiring 4 by the plasma deposition method or the coating deposition method. At this time, electric charges may be accumulated onto the interlayer films 1, 6 and 8 by plasma. The stopper films 5 and 7 are made of, for example, SiN, SiCN or SiC. The interlayer films 6 and 8 are made of, for example, the $SiO_2$, film deposited by the plasma method or the low-dielectric-constant film (Low-K film). When the interlayer film 8 is not the low-dielectric-constant film, the cover film 9 is unnecessary. In FIGS. 6B to 6D, FIGS. 7A and 7B, FIGS. 8A to 8C and FIGS. 9A to 9C, the barrier film 29 is not shown.

As shown in step S7 of FIG. 4 and FIG. 6C, a resist 10 having an opening 10a is formed on the cover film 9. The cover film 9, the interlayer film 8, the stopper film 7 and the interlayer film 6 are dry etched with the resist 10 as a mask to form a via 11. Electric charges may be accumulated onto the interlayer films 1, 6 and 8 by the dry etching. The opening 10a is provided in a region to form the via 11 in the next process. As shown in step S8 of FIG. 4 and FIG. 6D, oxygen ashing is conducted to the resist 10 to remove the resist 10. Electric charges may be accumulated onto the interlayer films 1, 6 and 8 by the oxygen ashing.

Figure 7A:
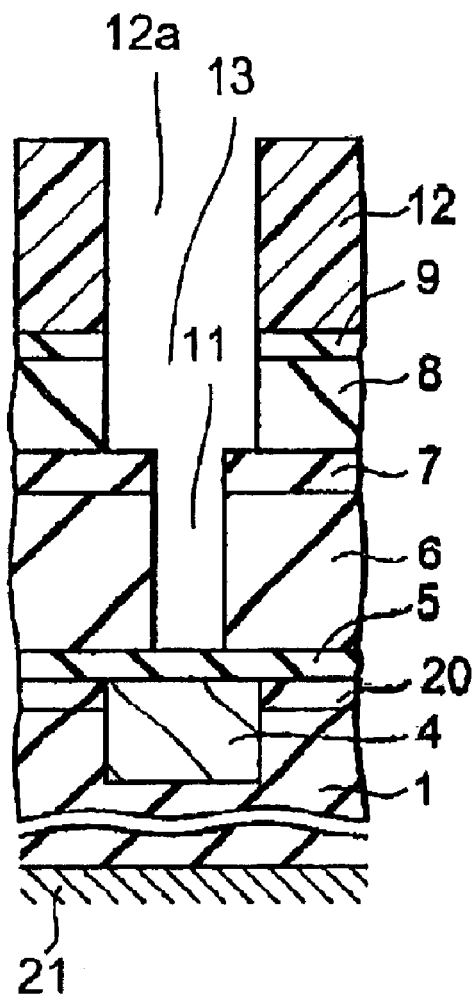
FIGS. 7A and 7B are schematic cross-sectional views showing the semiconductor device fabricating method according to the first embodiment in that process order and show the next processes of FIGS. 6A to 6D.

As shown in step S9 of FIG. 4 and FIG. 7A, a resist 12 is formed on the cover film 9. An opening 12a is provided in a region to form a channel 13 of the resist 12 in the next process. The cover film 9 and the interlayer film 8 are dry etched with the resist 12 as a mask to form the channel 13. The channel 13 will be used as a trench for wirings. Electric charges may be accumulated onto the interlayer films 1, 6 and 8 by the dry etching. As shown in step S10 of FIG. 4 and FIG. 7B, after the oxygen ashing is conducted to remove the resist 12, an etching back is conducted to remove the stopper film 5 in the via 11. At this time, electric charges may be accumulated onto the interlayer film 6 or 8 by the oxygen ashing. This can obtain a semiconductor device in which the wiring layer 4, interlayer films 6 and 8, via 11 and channels 13 are formed on the semiconductor substrate. An etching residue 14 (depot) remains in the via 11 and the channel 13.

Thereafter, in the process of steps S11 to S16, the semiconductor device formed in steps S1 to S15 is cleaned. As shown in step S11, IPA (isopropyl alcohol) is sprayed to the semiconductor device at room temperature for one minute to clean the semiconductor device. This moves part of electric charges accumulated onto the interlayer films 1, 6 and 8 to the IPA side so as to be removed. Since the IPA is a nonaqueous solvent, Cu constructing the Cu wiring 4 can be prevented from being ionized and eluted.

Figure 7B:
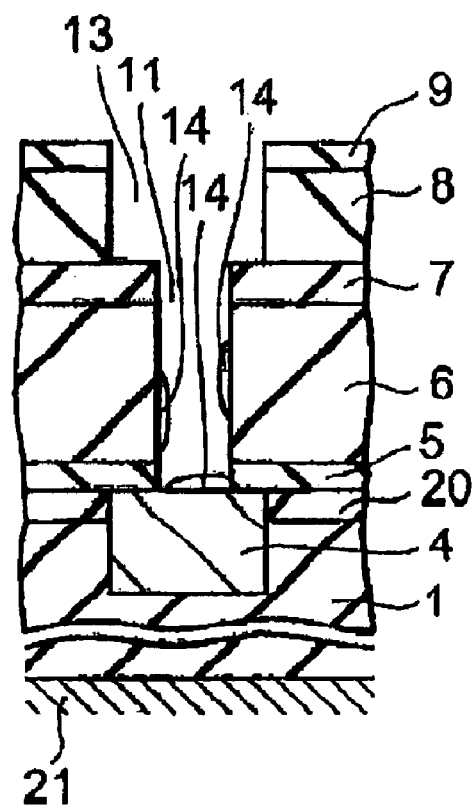
Figure 8C:
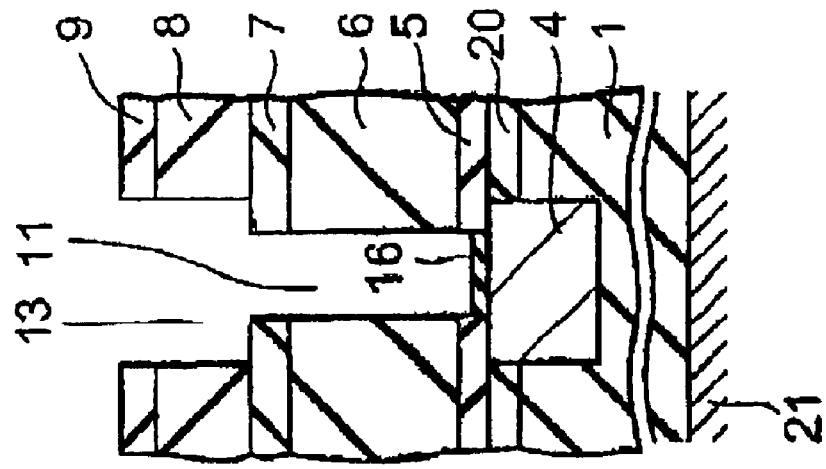
FIGS. 8A to 8C are schematic cross-sectional views showing the semiconductor device fabricating method according to this embodiment in that process order and show the next processes of FIGS. 7A and 7B.
Figure 8B:
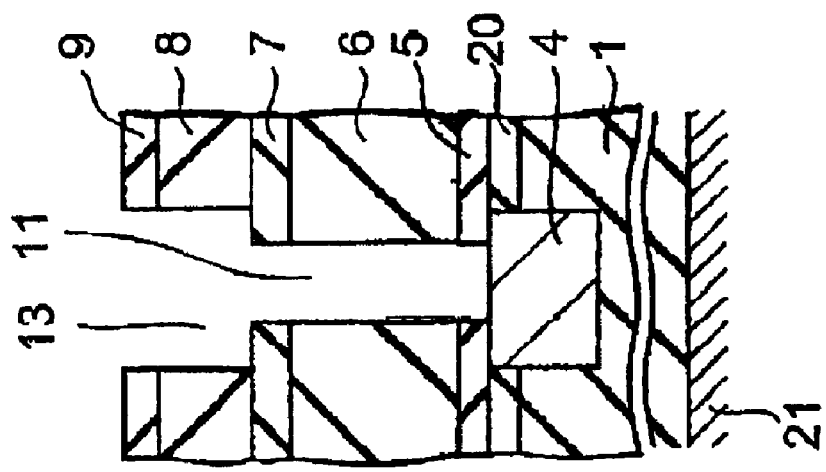
Figure 8A:
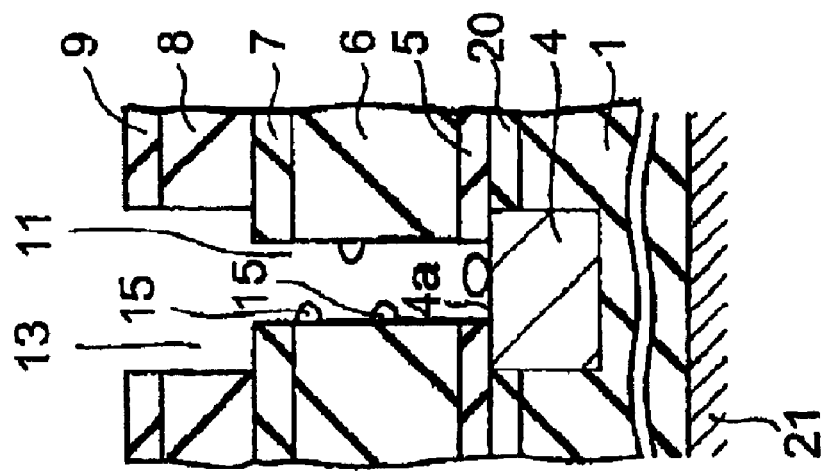
Figure 9C:
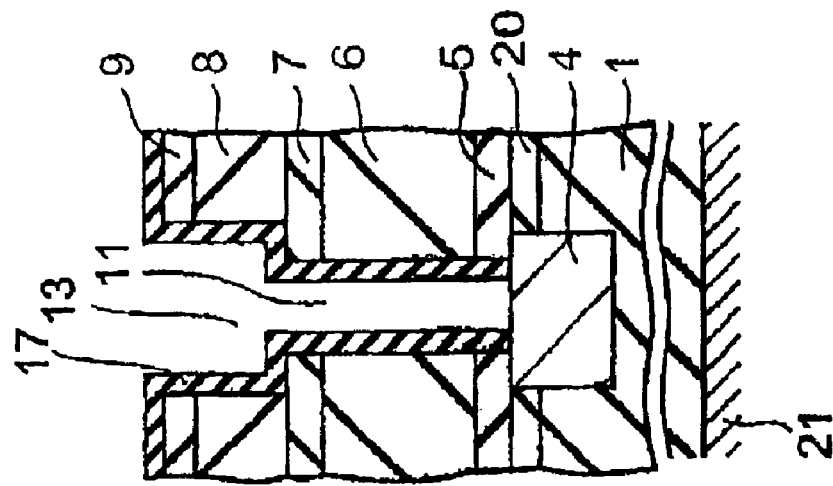
FIGS. 9A to 9C are schematic cross-sectional views showing the semiconductor device fabricating method according to this embodiment in that process order and show the next processes of FIGS. 8A to 8C.
Figure 9B:
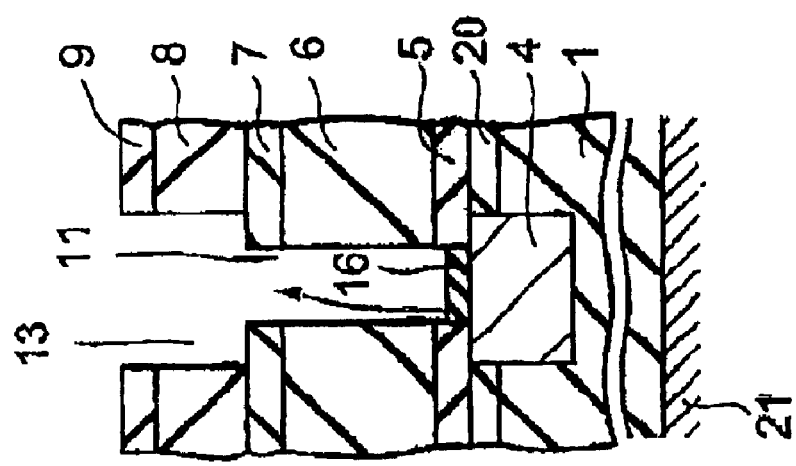

As shown in step S12 of FIG. 4 and FIG. 8A, an organic release process is conducted with an amine solvent to remove an etching residue 14 (see FIG. 7B). Under conditions of the organic release process, for example, the temperature is 70° C. and time is 10 minutes. At this time, in the via 11 and the channel 13, the etching residue 14 is removed and part of an amine 15 remains. As shown in step S13 of FIG. 4 and FIG. 8B, the semiconductor device is rinsed with the IPA to remove the remaining amine 15. The amine solvent may be the releasing liquid, comprising, for example, amine of 20% to 80% by mass, anticorrosive of less than 5% by mass, water of 5% to 30% by mass and alcohol of the rest of the releasing liquid. In addition, the releasing liquid is not limited by the amine solvent.

As shown in step S14 of FIG. 4 and FIG. 8C, a treating liquid prepared by adding, to the IPA, 5% by mass of benztriazole (BTA), 0.01% by mass of amine, and 1% by mass of water is sprayed to the semiconductor device. The treating liquid is alkalescent and has a pH, for example, below 8.5. This forms a BTA film 16 on an exposed part 4a of the Cu wiring 4 in the via 11. Preferably, as the amine, there may be used 1-amino-2-propanol, 2-amino-1-propanol, 3-amino-1-propanol, 2-methyl amino ethanol, 2-amino-2 amino-2-methy-1-propanol, 2-diethylaminoethanol, monoethanol amine, diethanol amine, triethanol amine, 2-(2-aminoethoxy)ethanol, 2-(2-aminoethylamino)ethanol, 2-(diethylamino)ethanol, 2-di(methylamine)ethanol, choline, morpholine, diethylenetriamine, or triethylenetetramine, or a mixture of those.

Figure 9A:
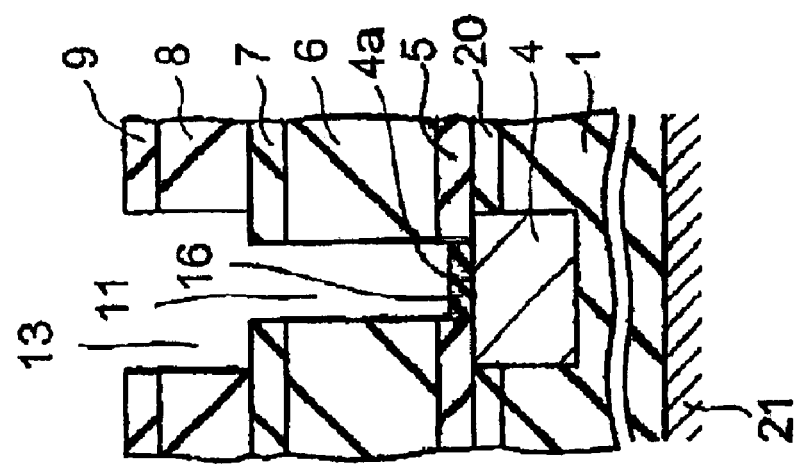

As shown in step S15 of FIG. 4 and FIG. 9A, the semiconductor device is rinsed with pure water or $CO_2$ water. The rinse conditions are 15 minutes at room temperature. At this time, since the BTA film 16 exists on the exposed part 4a of the Cu wiring 4 in the via 11, the Cu constructing the Cu wiring 4 can be prevented from being eluted or oxidized. The rinse removes the treating liquid and the BTA film 16 remains. As shown in step S16 of FIG. 4, the semiconductor device is dried. The semiconductor device is dried by jetting heated N2 gas for 10 minutes. The step S15 may be omitted. If the step 15 is omitted, the elution or oxidization of wiring may be prevented effectively.

After completing cleaning of the semiconductor device, as described above, thereafter, as shown in FIGS. 9B and 9C, a barrier metal is formed. The barrier metal is formed before forming the Cu wiring in the via 11 and the channel 13 by the plating method. As shown in FIG. 9B, as a pretreatment of the barrier metal deposition, preheating is conducted in a vacuum at the temperatures of above 200° C. for 20 to 30 seconds to perform RF sputtering by Ar gas or H2 gas, thereby removing the BTA film 16. As shown in FIG. 9C, a barrier metal 17 is deposited on the wiring layer 4 and in the inner surfaces of the via 11 and the channel 13 by a sputtering method or a CVD method. The inner surfaces of the via 11 and the channel 13 are coated by the barrier metal 17. The barrier metal 17 is made of TaN, Ta or TiN. Thereafter, a metal material such as Cu is buried in the via 11 and the channel 13 by the plating method or the CVD method to form a wiring.

After drying the semiconductor device shown in step S16, the BTA film 16 remains in the via 11. The BTA film 16 is removed by the preheating and RF sputtering shown in FIG. 9B. There arises no problem in the barrier metal 17 formation shown in FIG. 9C. The RF sputtering shown in FIG. 9B and the barrier metal 17 formation shown in FIG. 9C can be conducted in the same sputtering system. This performs RF sputtering in the chamber of the sputtering system, and then, the barrier metal 17 can be formed continuously without breaking the vacuum of the chamber.

As described above, in the first embodiment, the semiconductor device is cleaned with the IPA as a nonaqueous solvent in step S11. Electric charges accumulated onto the interlayer film can be discharged without eluting the Cu constructing the Cu wiring 4. When rinsing the semiconductor device with pure water or CO 2 water in step S15, the Cu constructing the Cu wiring 4 can thus be prevented from being eluted. The treating liquid is sprayed to the semiconductor device in step S14 to form the BTA film 16 on the exposed part 4a of the Cu wiring 4 in the via 11. In the semiconductor device rinsing process with pure water or $CO_2$ water in step S15, the Cu constructing the Cu wiring 4 can thus be prevented from being eluted. The exposed part 4a of the Cu wiring 4 after drying can be also prevented from being oxidized. This can increase time during which the cleaned semiconductor device can be maintained in a normal state, that is, allowable time. Time from the cleaning process to the next process can be increased to facilitate control of the fabricating process.

The first embodiment shows an example in which the semiconductor device is cleaned with the IPA in step S11 to form the BTA film 16 on the exposed part 4a of the Cu wiring 4 in step S14. In the present invention, only cleaning with the IPA is conducted to prevent to a considerable degree the Cu from being eluted in the later rinsing process with pure water or $CO_2$ water. As shown in the embodiment, both the cleaning with the IPA and the BTA film formation are performed to prevent the Cu elution in the above-described rinsing process with pure water more effectively.

Also in the embodiment, the treating liquid has a composition having 5% by mass of BTA, 0.01% by mass of amine, 1% by mass of water, and the remainder of the IPA. The treating liquid composition in the present invention is not limited to this. As the anticorrosive, in place of BTA, there may be used 1,2,3-tolyltriazole, 1,2,4-tolyltriazole, carboxybenztriazole, 1-hydroxybenztriazole, nitrobenztriazole, 5-methyl-1H benztriazole, dihydroxypropylbenztriazole, a ureic anticorrosive, or a purine compound anticorrosive. As the nonaqueous solvent, in place of IPA, there may be used isobutyl alcohol, isopentyl alcohol, ethyl ether, ethylene glycol monoethyl ether, propanol, 1-butanol, 2-butanol, methanol, methyl isobutyl ketone, or methyl ethyl ketone.

When the BTA is used as the anticorrosive and the IPA is used as the nonaqueous solvent, preferably, the BTA is 0.5 to 30% by mass, amine is 0.0005 to 1% by mass, and water is 0.1 to 5% by mass. Water and amine in the range are added to the treating liquid to make the treating liquid alkalescent. This can stabilize a bonding of BTA and Cu and the BTA film.

Figure 10:
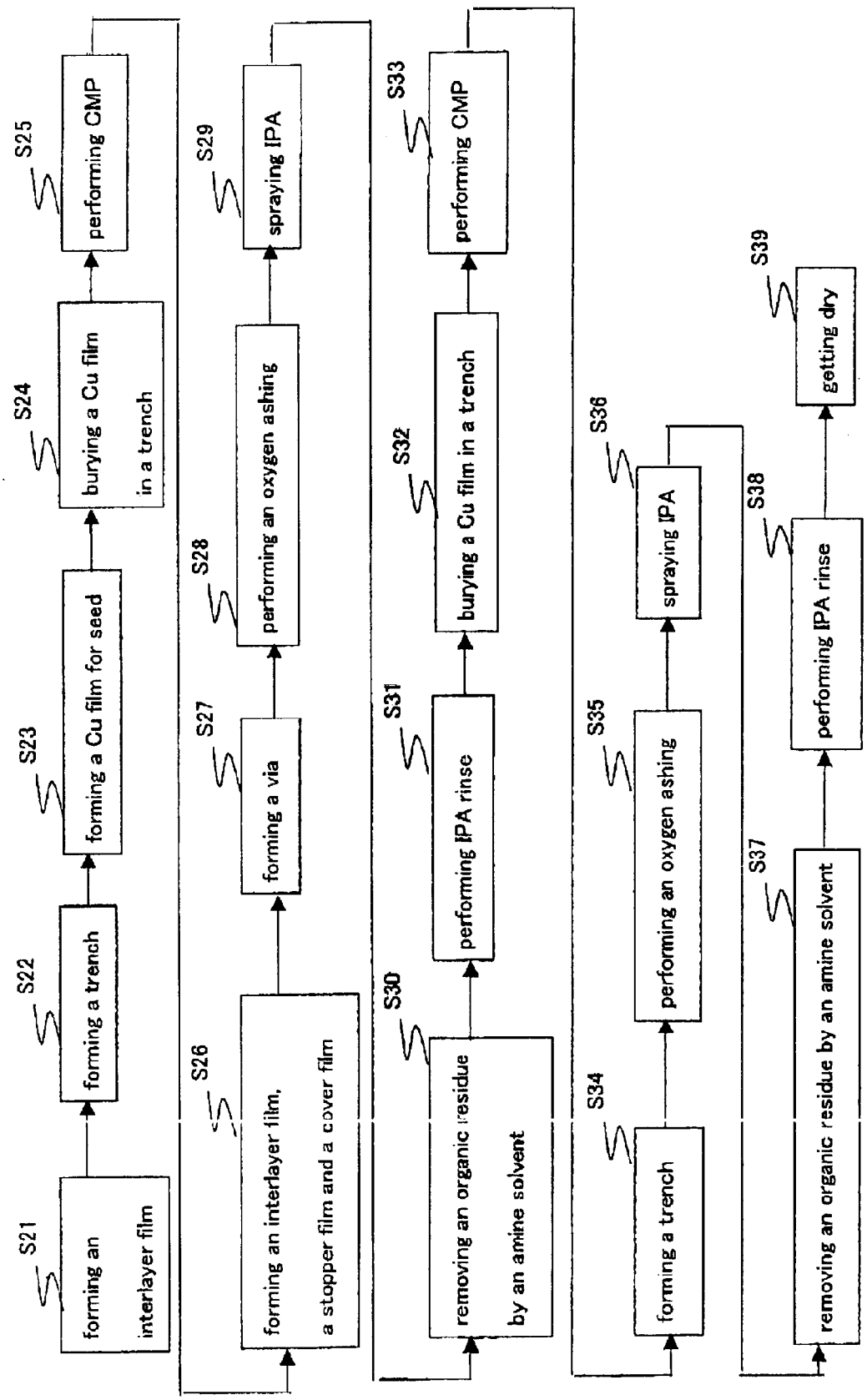
FIG. 10 is a flowchart showing a semiconductor device fabricating method with an organic release liquid according to a second embodiment of the present invention.

Next, the second embodiment of the present invention will be described. FIG. 10 is a flowchart showing a semiconductor device fabricating method with an organic release liquid according to the second embodiment of the present invention. FIGS. 11A to 11D, and FIGS. 12A to 12C are cross-sectional views showing the semiconductor device fabricating method in that process order.

As shown in steps S21 to S25 of FIG. 10 and FIG. 11A, an interlayer film 31 is formed on a semiconductor substrate 21 and a cover film 30 is formed on the interlayer film 31. A channel is formed in the cover film 30 and the interlayer film 31. A barrier film (not shown in fitures) comprising a Ta film and a TaN film is formed on the surface of the channel. And then, a Cu film for seed is deposited on the barrier film. A Cu layer is formed to bury the channel. The Cu layer on the cover film 30 is removed by CMP to make the upper surfaces of the Cu layer and the cover film 30 plane. The Cu wiring 32 is formed in the interlayer film 31. The interlayer film 31 is made of, for example, a low-dielectric-constant film (Low-K film). The cover film 30 is made of, for example, $SiO_2$ or SiN. Processes shown in steps S21 to S25 of FIG. 10 are the same steps as processes shown in steps S1 to S5 of FIG. 4, FIGS. 5A to 5D and FIG. 6A.

After that, as shown in steps S26 of FIG. 10 and FIG. 11A, a stopper film 33, an inter layer film 34 and a cover film 35 are formed on the cover film 30 and the Cu wiring 32 in that order. Electric charges may be accumulated on to the interlayer films 31 and 34 by step S21 for forming the interlayer film 31, step S22 for forming the channel, step S23 for forming the Cu film for seed and step S26 for forming the stopper film 33, the inter layer film 34 and the cover film 35. When the interlayer film 31 is made of, for example, a plasma $SiO_2$ which is other than the Low-K film, the cover film 30 is unnecessary. The stopper film 33 is made of, for example, SiN, SiCN or SiC. The interlayer film 34 is made of, for example, the Low-K film. Further, the cover film 35 is made of, for example, $SiO_2$ or SiN. Further, material construdting the wiring is not limited to Cu. The wiring may be formed by Ag, Ag alloy or Cu alloy. When the interlayer film 34 is not the Low-K film, but is an plasma $SiO_2$ film, for example, the cover film 35 is unnecessary.

Next, as shown in step S27 of FIG. 10 and FIG. 11B, a resist 36 having an opening 36a is formed on the cover film 35. As shown in FIG. 11C, the cover film 35 and the interlayer film 34 are dray etched with the resist 36 as a mask to form a via 37. Electric charges may be accumulated onto the inter layer films 31 and 34 by the dray etching. The opening 36a is provided in a region to form the via 37 in the next process. As shown in step S28 and FIG. 11D, oxygen ashing is conducted to the resist 36 to remove the resist 36. Then, etching back is conducted to remove the stopper film 33. Electric charges may be accumulated on to the interlayer film 31 and 34 by the oxygen ashing. After oxygen ashing, an etching residue 38 (depot) remains in the via 37 and the cover film 35.

Thereafter, in the process of steps S29 to S31, the semiconductor device formed in steps S21 to S28 comprising the semiconductor substrate, the interlayer film 31, the cover film 30, the Cu wiring 32, the stopper film 33, the interlayer film 34 and the cover film 35 is cleaned. As shown in step S29, IPA (isopropyl alcohol) is sprayed to the semiconductor device, for example, at room temperature for one minute to clean the semiconductor device. This moves part of electric charges accumulated onto the interlayer films 31 and 34 to the IPA side so as to be removed. Since the IPA is a nonaqueous solvent, Cu constructing the Cu wiring 32 can be prevented from being ionized and eluted.

As shown in step S30 of FIG. 10, an organic release process is conducted with an amine solvent to remove an etching residue 38. Under conditions of the organic release process, for example, the temperature is 70° C. and time is 10 minutes. At this time, in the via 37 and the cover film 35, the etching residue 38 is removed and part of an amine remains. As shown in step S31 of FIG. 10, the semiconductor device is rinsed with the IPA to remove the remaining amine. After that, the semiconductor device is dried in $N_2$ gas.

Thereafter, a metal material such as Cu is buried in the via 37. As shown in step S33, CMP is conducted to the Cu film deposited onto a part other than the inside of the via 37. This forms a Cu wiring 39 in the via 37.

Figures 12A, 12B, 12C:
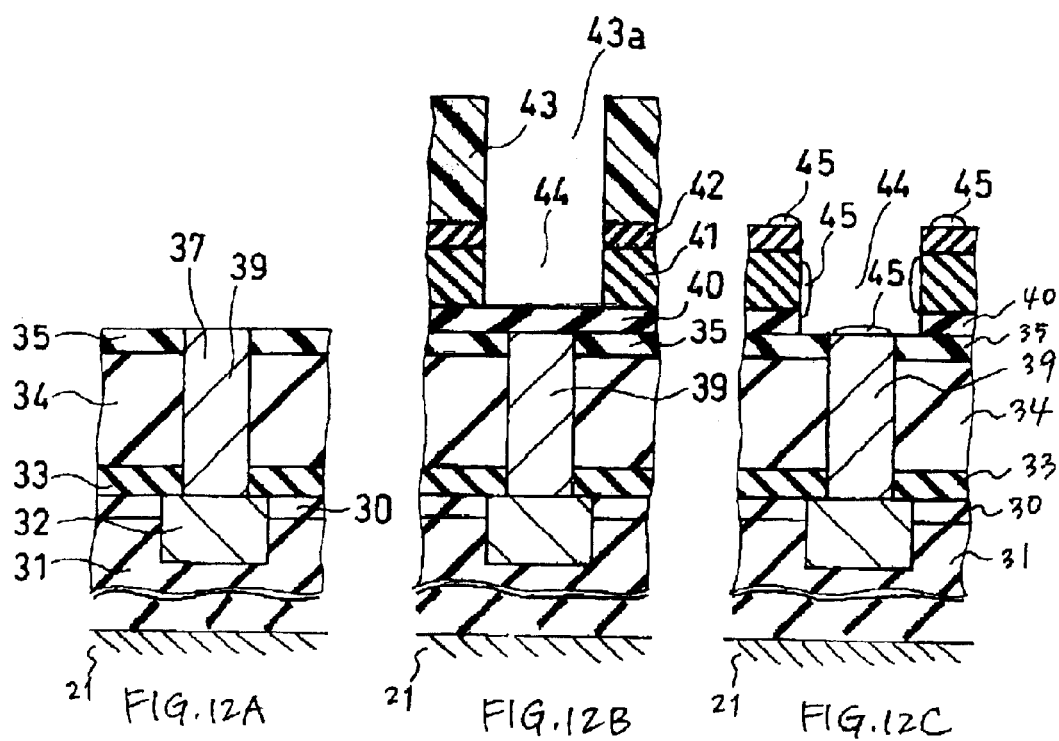
FIGS. 12A to 12C are schematic cross-sectional views showing the semiconductor device fabricating method according to the second embodiment in that process order and show the next processes of FIGS. 11A to 11D.

As shown in step S34 of FIG. 10 and FIG. 12B, a stopper film 40, an interlayer film 41 and a cover film 42 are formed in that order on the cover film 35 and a Cu wiring 39. When the inter layer film 41 is not a Low-K film, the cover film 41 is unnecessary. In this process, electric charges may be accumulated on to the inter layer film 31, 34 and 41. A resist 43 having an opening 43a is formed on the cover film 42. The cover film 42 and the interlayer film 41 are dry etched with the resist 43 as a mask to form a channel 44. The stopper film 40 is made of, for example, SiN, SiCN or SiC. The cover film 42 is made of, for example, $SiO_2$ or SiN.

As shown in step S35 of FIG. 10 and FIG. 12C, oxygen ashing is conducted to the resist 43 to remove the resist 43. Then, etching back is conducted to remove the stopper film 40 on the bottom of the channel 44. Electric charges may be accumulated on to the interlayer film 31, 34 and 41 by oxygen ashing. After oxygen ashing, an etching residue 45 (depot) remains in the channel 44 and on the cover film 42.

As shown in steps S36 to S38 of FIG. 10, an inside of the channel 44 and the top surface of the cover film 42 are cleaned. Cleaning processes shown in steps S36 to S38 are the same as cleaning processes shown in steps S29 to S31. As shown in steps S39 of FIG. 4, the inside of the channel 44 and the top surface of the cover film 42 are dried. The semiconductor device is dried by jetting heated N2 gas to the inside of the channel 44 and the top surface of the cover film 42 for 10 minutes, or the semiconductor wafer is revolved in $N_2$ gas at the room temperature. This completes cleaning processes of the inside of the channel 44 and the top surface of the cover film 42.

As described above, according to the second embodiment of the present invention, since the semiconductor device is cleaned by IPA as a nonaqueous solvent at steps S29 and S36. Electric charges accumulated onto the inter layer film can be released with out eluting metal constituting the Cu wiring 32 and 39.

Further, according to the second embodiment of the present invention, since the semiconductor device is formed by a process for cleaning with IPA as a final cleaning process without a process for cleaning with pure water or $CO_2$ water. Therefore, the metal. constructing the Cu wiring 32 and 39 can be prevented from being eluted due to the process for cleaning with pure water or $CO_2$ water. As a result, as described in the first embodiment, it is not necessary to form a BTA film on an exposed part of the Cu wiring in the via. The semiconductor device fabricating process is simplified.

Figure 13:
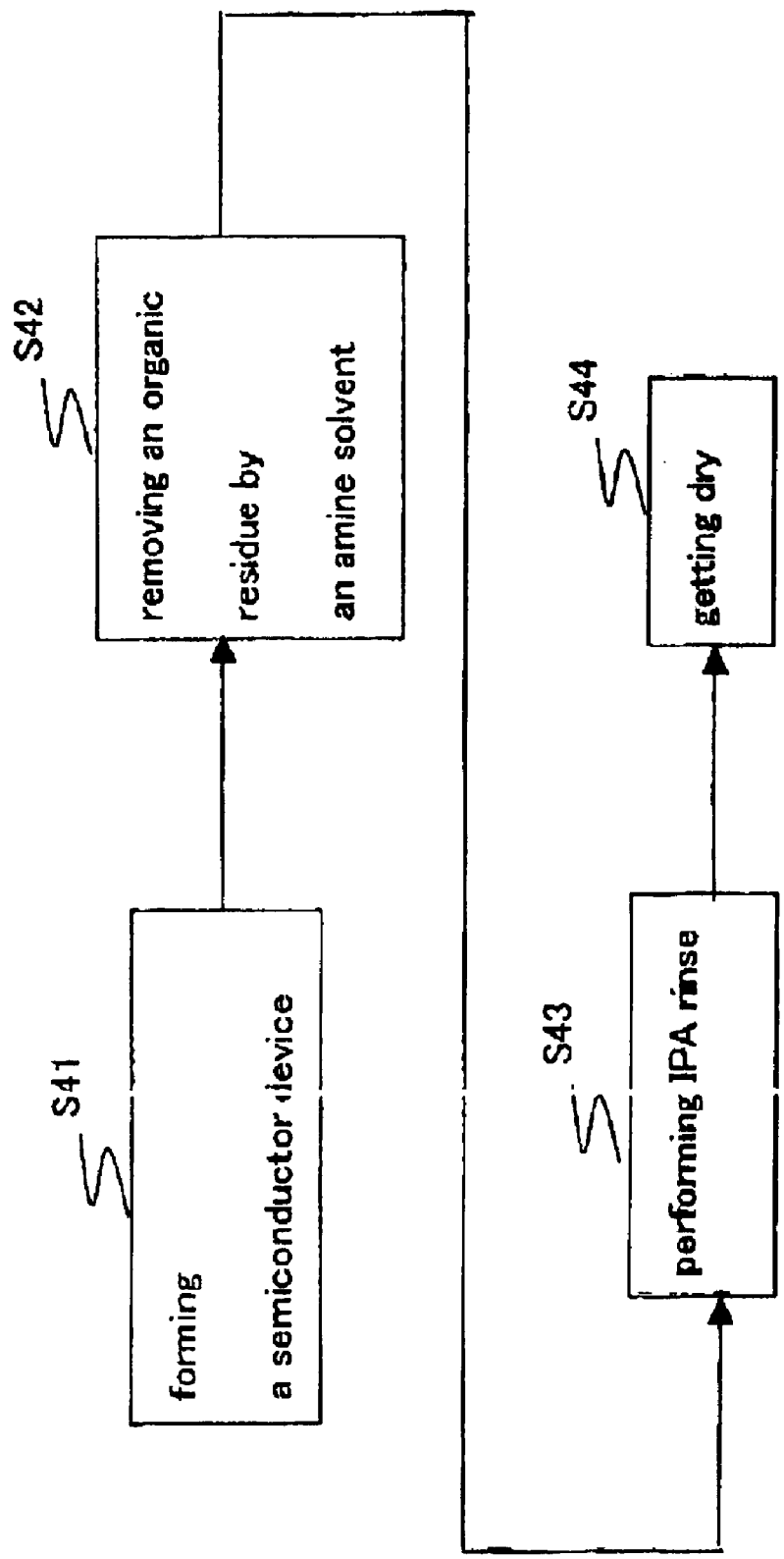
FIG. 13 is a flowchart showing a semiconductor device fabricating method with an organic release liquid according to a third embodiment of the present invention.
Figure 14:
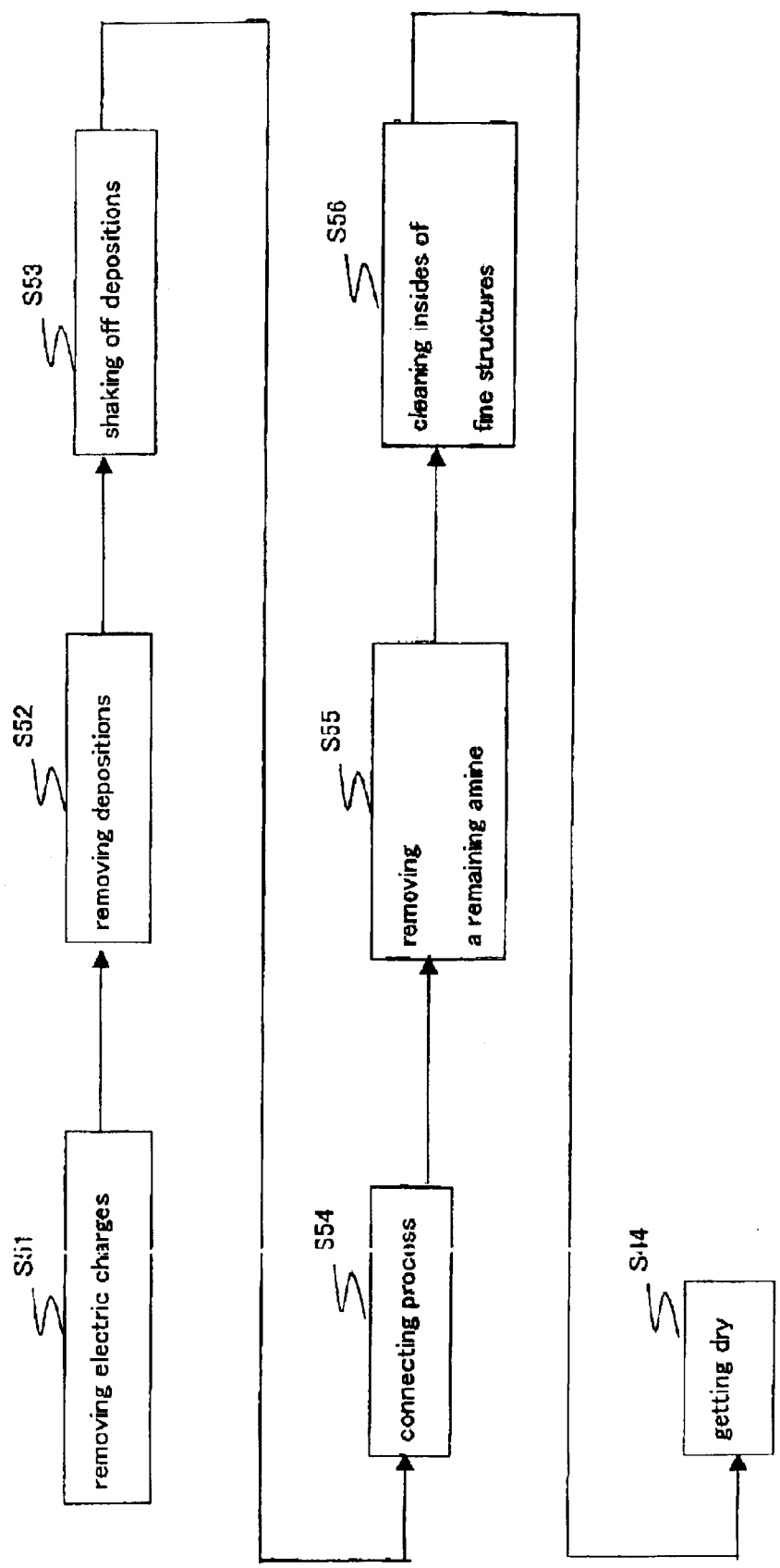
FIG. 14 is a flowchart showing step S43 of FIG. 13 of an IPA rinse process and step 544 of FIG. 13 of an dry process in more detail.

Next, the third embodiment of the present invention will be described. FIG. 13 is a flowchart showing a semiconductor device fabricating method with an organic release liquid according to a third embodiment. FIG. 14 is a flowchart showing step S43 of FIG. 13 of an IPA rinse process and step S44 of FIG. 13 of an dry process in more detail. Table 1 shows conditions of each process. According to the third embodiment, a semiconductor device is rinsed with IPA as a final cleaning process without pure water or $CO_2$ water. In this case, when a rinse process with IPA is merely in place of a rinse process with water, stains and deposition may remain on the silicon wafer. Therefore, according to the third embodiment, the rinse process with IPA is modified to prevent the stains arid the deposition from remaining on the silicon wafer.

As shown in step S41 of FIG. 13, a semiconductor device is formed by processes which is similar to the first embodiment which is described above. In other words, processes shown in step S41 of FIG. 13 are the same as processes shown in step S1 to S10 of FIG. 4. By those processes, the semiconductor device is formed as shown in FIG. 7B. The semiconductor device is formed on a silicon wafer (hereinafter a wafer). An etching residue 14 (depot) remains in the via 11 and the channel 13. Electric charges may be accumulated onto the interlayer film 1, 6 and 8.

After that, as shown in step S42 of FIG. 13, an organic release process is conducted with an amine solvent to remove an etching residue 14 (shown in FIG. 7B) and to remain a part of the amine 15. The organic release process is conducted as an organic release process in step S12 of FIG. 4 and FIG. 8A is conducted.

Next, as shown in step S43 of FIG. 13, a rinse process of the semiconductor device with IPA is conducted. In the rinse process, IPA,is sprayed to the surface of the wafer having a semiconductor device while the wafer is revolved. Steps S51 to S56 of FIG. 14 shows steps S43 of FIG. 13 in more detail. Table 1 shows process times and wafer revolving speed (rpm) of each steps S51 to S56.

TABLE 1

| step | treatment | spray time | wafer revolving speed | purpose |
|---|---|---|---|---|
| S51 | IPA spray | 30–60 | 10–500 | removing electric charges |
| S52 | IPA spray | 30–600 | 100–1000 | removing depositions |
| S53 | IPA spray | 30–600 | 500–2000 | shaking off depositions |
| S54 | IPA spray | 30–600 | 10–1000 | connecting process |
| S55 | IPA spray | 30–600 | 10–500 | removin amine |
| S56 | IPA spray and | IPA: 3–15 | 100–2000 | cleaning an inside |

TABLE 1-continued

| step | treatment | spray time | wafer revolving speed | purpose |
|---|---|---|---|---|
| | N2 gas jet repeat 2–5 times | $N_2$: 3–15 | | of fine structure |
| S44 | N2 gas jet | 30–600 | 10–2000 | getting dry |

A rinse method of a wafer with IPA will be described as shown in FIG. 14 and Table 1. A shown in step S51 of FIG. 14, while the wafer is revolved at a speed of 10 to 500 rpm, for example, 50 rpm, IPA is sprayed to the wafer for 30 to 60 seconds, for example, 60 seconds. IPA which is electrically neutral is used. Electric charges accumulated into the interlayer film 1, 6 and 8 moves to the IPA side so as to removed from the wafer. Further, since the IPA is an nonaqueous solvent, Cu constructing the Cu wiring can be prevented from being ionized and eluted.

As shown in step S52, while the wafer is revolved at a speed of 100 to 1000 rpm, for example, 500 rpm, the IPA is sprayed to the wafer for 30 to 600 seconds, for example, 60 seconds so as to remove the deposition on the surface of the wafer.

As shown in step S53, while the wafer is revolved at a speed of 500 to 2000 rpm, preferably 1000 to 2000 rpm, for example, 2000 rpm, the IPA is sprayed to the wafer for 30 to 600 seconds, for example, 120 seconds. The wafer is revolved in step S53 at a higher speed than in other steps so as to shake off depositions on the surface of the wafer by the centrifugal force. At this time, the IPA is scattered from the wafer to an inner wall of a chamber for cleaning the wafer so as to remove depositions on the inner wall of the chamber. As a result, the depositions on the inner wall of the chamber can be prevented from re-depositing on the surface of the water.

As shown in step S54, while the wafer is revolved at a speed of 10 to 1000 rpm, for example, 50 rpm, the IPA is sprayed to the wafer for 30 to 600 seconds, for example, 30 seconds. This process is a connecting process from step S53 of the higher speed revolving to the next steps of a lower speed revolving.

As shown in step S55, while the wafer is revolved at a speed of 10 to 500 rpm, for example, 50 rpm, the IPA is sprayed to the wafer for 30 to 600 seconds, for example, 30 seconds. In this process, specially pure IPA is used so as to almost completely remove the amine remaining on the surface of the wafer.

As shown in step S56, an intermittent IPA treatment is conducted. In other words, while the wafer is revolved at a speed of 100 to 2000 rpm, for example, 500 rpm, the IPA is sprayed to the wafer for 3 to 15 seconds, for example, 5 seconds and then N2 gas is jetted to the wafer for 3 to 15 seconds, for example, 10 seconds so as to dry the wafer. Processes comprising spray process and dray process are repeated twice to five times, for example, three times. In this process, specially pure IPA is used so as to repeat providing and removing the fresh pure IPA into fine structures of the semiconductor device, such as vias. Therefore, the inside of the fine structures are cleaned. As a result, stains, which is caused by eluted constituent from the inside of the fine structures to IPA, can be prevented from remaining on the wafer. The stain is corresponding to water marks occurring at a water rinse process.

As shown in step S44, while the wafer is revolved at a speed of 10 to 2000 rpm, for example, 1000 rpm, the N2 gas is jetted to the wafer for 30 to 600 seconds, for example, 200 seconds so as to dry the wafer. The cleaning of the semiconductor device is completed.

According to the third embodiment of the present invention, electric charges accumulated onto the wafer are removed at step S51. The depositions are removed from the surface of the wafer at steps S52 and S53. The amine constituent remaining on the surface of the wafer is removed at step S55. The fine structures, such as vias, formed on the wafer is cleaned at step S56 so as to prevent stain from remaining on the wafer. As a result, while the semiconductor device is rinsed with IPA as the final cleaning process without pure water or $CO_2$ water, stains and depositions can be prevented. Since the cleaning process with pure water or $CO_2$ water is unnecessary, the metal constructing the wiring can be prevented from being eluted and ionized more effectively even when the area of the wiring is relatively large. Further, there is no cleaning process with pure water or $CO_2$ water, cleaning process with the treating liquid containing the anticorrosive can be omitted. On the other hand, when the area of the wiring is not relatively large, the metal constructing the wiring can be prevented from being eluted even though the cleaning process with pure water or $CO_2$ water is performed after the cleaning process with the IPA as described in the first embodiment. Further, according to the third embodiment, performing only steps S53 to S55 can show some efficiency without performing steps S51, S52 and S56.

Effects of the examples of the present invention will be specifically described as compared with a comparative example deviated from claims.

FIRST TEST OF EXAMPLE

According to tho first test of example, samples are fabricated by different cleaning processes of each. Then, the presence or absence of elution of the Cu wiring of each sample is evaluated.

Figure 15A:
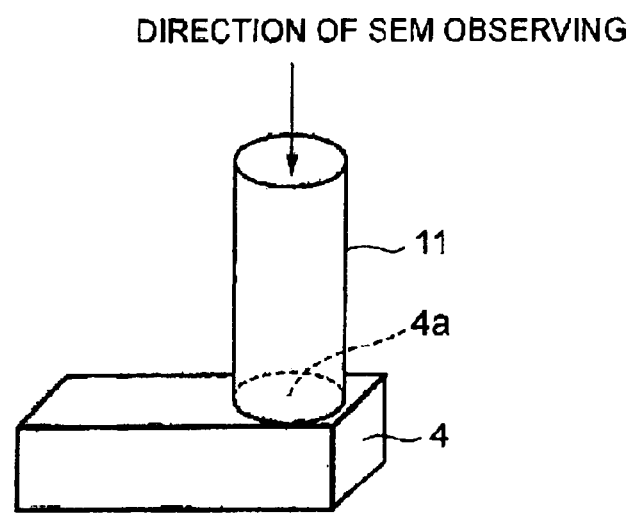
FIG. 15A is a perspective view showing a SEM observing method of Cu wirings in vias.
Figure 15B:
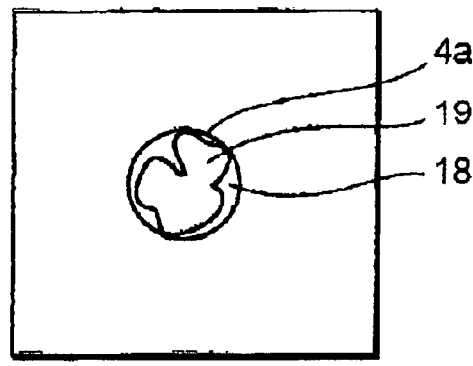
FIG. 15B is a diagram showing the observing result of a Cu wiring of Comparative Example No. 2.
Figure 15C:
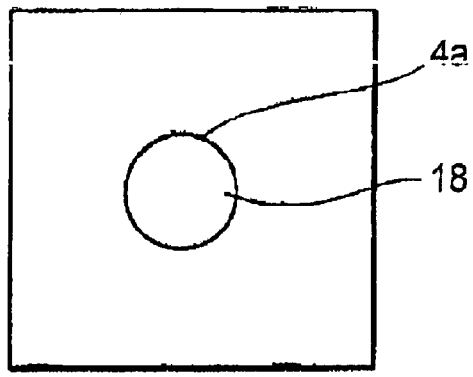
FIG. 15C is a diagram showing the observing result of a Cu wiring of Example No. 3.

FIG. 15A is a perspective view showing an observing method of the Cu wiring in a via of the sample after cleaning processes. FIG. 15B is a diagram showing the SEM (scanning electron microscope) observing result of the Cu wiring of Comparative Example No. 2. FIG. 15C is a diagram showing the SEM observing result of the Cu wiring of Example No. 3.

Figures 16A, 16B:
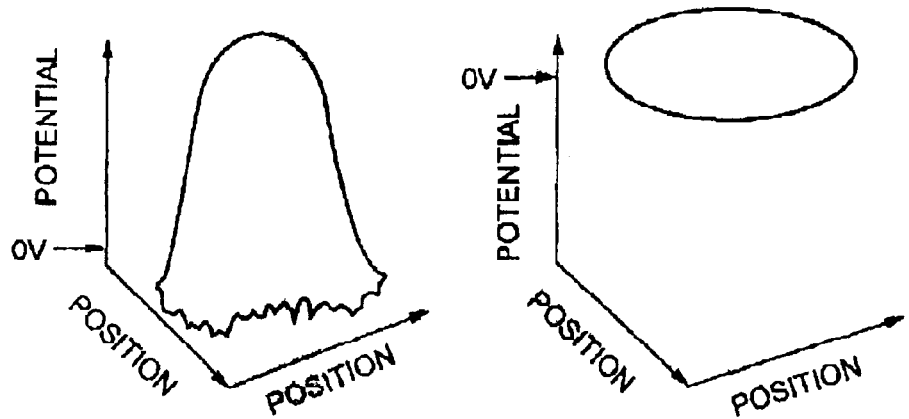

FIGS. 16A and 16B are graphs using the position of the sample (wafer) surface to enter the horizontal axis and the potential to enter the vertical axis to show the potential distribution measuring results of the sample. FIG. 16A shows the potential distribution of the sample before an IPA spray process. FIG. 16B shows the potential distribution of the sample after the IPA spray process.

Figure 17:
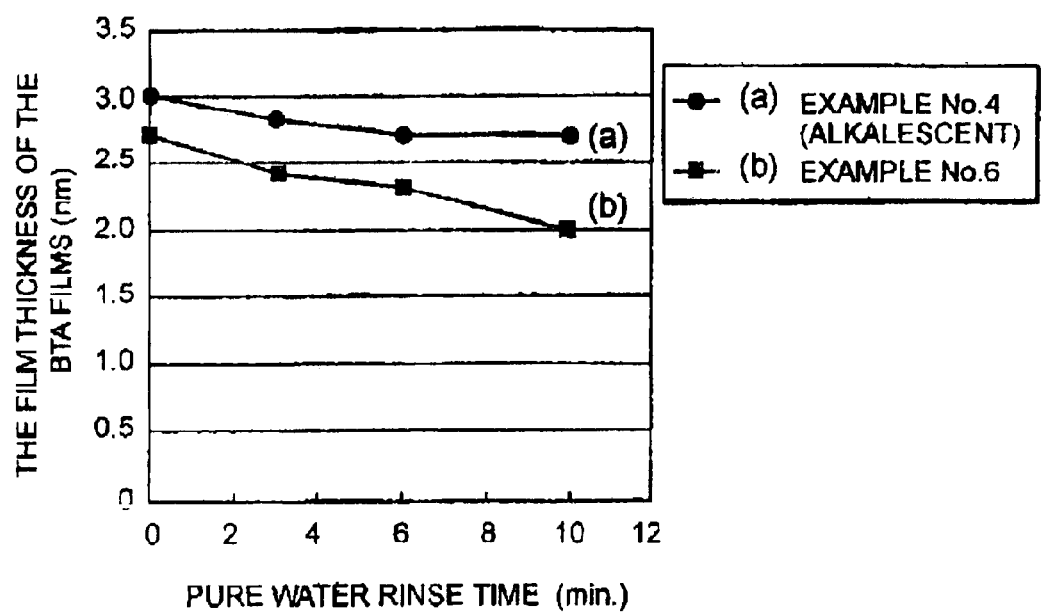
FIG. 17 is a graph using the pure water rinse time to enter the horizontal axis and the film thickness of BTA films to enter the vertical axis to show pure water rinse time dependence of the film thickness of the BTA films in which a graph (a) shows the measuring result of Example No. 4 and a graph (b) shows the measuring result of Example No. 6.

FIG. 17 is a graph using the pure water rinse time to enter the horizontal axis and the film thickness of the BTA films to enter the vertical axis to show pure water rinse time dependence of the film thickness of the BTA films. A graph (a) shows the measuring result of Example No. 4, that is, the case of using a treating liquid prepared to be alkalescent by adding amine to perform the BTA-added IPA process. A graph (b) shows the measuring result of Example No. 6, that is, the case of using a treating liquid not prepared to be alkalescent without adding amine to perform the BTA-added IPA process.

A sample fabricating method will be described first. An interlayer film is formed on a semiconductor substrate to form a Cu wiring in the interlayer film by sputtering and plasma CVD, forming an SiN film on the interlayer film and the Cu wiring. $SiO_2$ is deposited on the SiN film by the plasma method to form an interlayer film, forming a via by dry etching in a position matched with the Cu wiring in the interlayer film to provide a sample. Eight samples are fabricated.

The samples are cleaned in accordance with the processes shown in Table 2. The processing methods in the first, second and third embodiments of the present invention. "IPA1" shown in Table 2 indicates an IPA spray process shown in step S11 of FIG. 4 and steps S29 and S31. "Organic release" indicates an organic release process with an amine solvent shown in step S12 of FIG. 4 and steps S30 to S37. "IPA2" indicates an IPA rinse shown in step S13 of FIG. 4 and steps S31 to S38. "IPA3" indicates an IPA rinse shown in step S43 of FIG. 13 according to the third embodiment. In other words, "IPA3" indicates sequential processes shown in steps S51 to S56 of FIG. 14. "BTA aqueous solution" indicates a BTA film forming process with a BTA-added IPA treating liquid (aqueous solution) shown in step S14 of FIG. 4. "BTA-added IPA" indicates a BTA-added IPA process" in which water and amine are not added to the treating liquid and a treating liquid not prepared to be alkalescent is used. "Pure water" and "$CO_2$ water" indicate pure water rinse and $CO_2$ water rinse shown in S15 of FIG. 4, respectively. "Drying" indicates a drying process shown in S16 of FIG. 4, step S30 of FIG. 10 and step S44 of FIG. 13. A revolving speed of the wafer is 1000 rpm and a processing time is 200 seconds at the drying process.

TABLE 2

| | No. | Process | Elution |
|---|---|---|---|
| Example | 1 | IPA1-Organic release-IPA2-$CO_2$ water-Drying | ○ |
| Comparative Example | 2 | Organic release-BTA aqueous solution-$CO_2$ water-Drying | X |
| Example | 3 | IPA1-Organic release-IPA2-BTA aqueous solution-$CO_2$ water-Drying | ○ |
| Example | 4 | IPA1-Organic release-IPA2-BTA aqueous solution-Pure water-Drying | ○ |
| Example | 5 | IPA1-Organic release-IPA2-BTA-added IPA-$CO_2$ water-Drying | ◎ |
| Example | 6 | IPA1-Organic release-IPA2-BTA-added IPA-Pure water-Drying | ◎ |
| Example | 7 | IPA1-Organic release-IPA2-Drying | ◎+ |
| Example | 8 | Organic release-IPA3-Drying | ◎+ |

Further, Table 3 shows sequential processes of "IPA3" in detail. As shown in Table 3, according to "IPA3", a wafer is in a chamber, and processes shown below as Process No. (I) to (VI) are performed in that order. "Corresponding step" indicates step of FIG. 14 corresponding to each process.

TABLE 3

| Process No. | Process | processing time (seconds) | wafer revolving speed (rpm) | corresponding step |
|---|---|---|---|---|
| (I) | IPA spray | 60 | 50 | S51 |
| (II) | IPA spray | 60 | 500 | S52 |
| (III) | IPA spray | 120 | 2000 | S53 |
| (IV) | IPA spray | 60 | 50 | S54 |
| (V) | IPA spray | 30 | 50 | S55 |
| (VI) | (IPA spray + drying) repeating 3 times | spray: 5 dray: 10 | 1000 | S56 |

(I) While the wafer is revolved at a speed of 50 rpm, an IPA which was not in use is sprayed to the wafer for 60 seconds so as to remove electric charges accumulated onto the wafer. The IPA is electrically neutral. The IPA sprayed to the wafer is discarded. In other words, the IPA is disposable and it is not reused.

(II) While the wafer is revolved at a speed of 500 rpm, IPA is sprayed for 60 seconds to remove depositions on the surface of the wafer. The IPA is in a tank which is 10 to 20 litters in capacity. The IPA of one fourth to one third of the capacity of the tank per minute is sprayed. The IPA sprayed to the wafer is returned to the tank as a circulatory system and then reused.

(III) While the wafer is revolved at a speed of 2000 rpm, the IPA is sprayed to the wafer for 120 seconds to shake off the depositions on the surface of the wafer by the centrifugal force. The IPA which is shaken off from the surface of the wafer reaches to the inner wall of the chamber to clean the inner wall of the chamber. The IPA is reused as the circulatory system as described in Process (II). The amine constituent remaining on the surface of the wafer is removed also.

(IV) While the wafer is revolved at a speed of 50 rpm, the IPA is sprayed to the wafer 60 seconds. The IPA is reused as the circulatory system as described in Process (II).

(V) While the wafer is revolved at a speed of 50 rpm, the IPA which was not in use is sprayed to the wafer for 30 seconds so as to remove the amine constituent remaining on the surface of the wafer completely. The IPA sprayed to the wafer is discarded not to be reused.

(VI) While the wafer is revolved at a speed of 100 rpm, the IPA which was not in use is sprayed to the wafer for 5 seconds, and then $N_2$ gas is jetted to the wafer for 10 seconds to dry the wafer. The process for spraying and the process for drying are repeated three times. The fine structures on the surface of the wafer is cleaned.

For the samples after cleaned in this manner, the presence or absence of elution of the Cu wiring in the via is evaluated by observing the exposed part of the Cu wiring via the via by an SEM (scanning electron microscope). The evaluating results are shown in Table 1. In Table 1, the sample in which elution is clearly observed is evaluated to be failure (X), the sample in which elution is slightly observed is evaluated to be good (○), the sample in which elution is hardly observed is evaluated to be very good (⊙), and the sample in which elution is not observed at all is evaluated to be excellent (⊙⁺). In addition, part of the SEM observing results is shown in FIGS. 15A to 15C. Further, the potential distribution of the sample before and after the IPA spray process is measured. The measuring results are shown in FIGS. 16A and 16B. Furthermore, for Nos. 4 and 6 shown in Table 1, pure water rinse time dependence of the film thickness of the corrosion-resistant films (BTA films) formed on the Cu wirings is inspected by the BTA-added IPA process. The inspecting results are shown in FIG. 17.

Nos. 1, 3 to 8 shown in Table 2 are examples of the present invention. For Examples Nos. 1, 3 to 7, the IPA spray process (IPA1) before the organic release process is performed to the samples. Elution of the Cu wirings is hardly observed or is not observed at all.

In particular, in Examples Nos. 5 and 6, the BTA-added IPA process is performed before the $CO_2$ water rinse ($CO_2$ water) or pure water rinse (pure water). Since water is not added in the treating liquid, Cu elution is not observed at all. In Example Nos. 7 and 8, since $CO_2$ water rinse and pure water rinse are not performed, Cu elution is not observed at all. Especially, in Example No. 8, since sequential processes as "IPA3" shown in Table 3, stains and depositions are not observed at all on the surface of the wafer.

On the contrary, No. 2 shown in Table 1 is a comparative example. In Comparative Example 2, a Cu wiring and a via are formed on a semiconductor substrate, and then, the organic release process is performed without conducting the IPA spray process. Thereafter, the $CO_2$ water rinse is performed. Neutralization of the sample during the $CO_2$ water rinse is not enough so that the Cu wiring is eluted.

As shown in FIG. 15A, the exposed part 4a of the Cu wiring 4 is observed from the top by the SEM via the via 11 formed on the Cu wiring 4. As a result, as shown in FIG. 15B, in Comparative Example No. 2, a noncorrosive part 18 is observed in a peripheral part of the exposed part 4a of the Cu wiring 4. A corrosive part 19 is observed in the center part thereof to find Cu elution. As shown in FIG. 15C, in Example NO. 3, no corrosive part is observed in the exposed part 4a of the Cu wiring 4 so that the entire exposed part 4a is the noncorrosive part 18.

As shown in FIGS. 16A and 16B, in Example No. 1, the potential distribution of the sample before and after an IPA spray process ("IPA1") is measured. As a result, the sample before the IPA spray process becomes positively charged, in particular, the electrostatic charge of the center part of the sample is large, and the sample after the IPA Spray process is neutralized.

As shown in FIG. 17, in the case of using, as the treating liquid, the BTA-added IPA treating liquid prepared to be alkalescent by adding amine, as compared with in the case of using the BTA-added IPA treating liquid to which no amine is added, the BTA film immediately after being formed is thick and the film thickness can be maintained relatively stably when giving pure water rinse. This is because the treating liquid is prepared to be alkalescent to further stabilize the bonding of BTA and Cu.

SECOND TEST OF EXAMPLE

Figure 18:
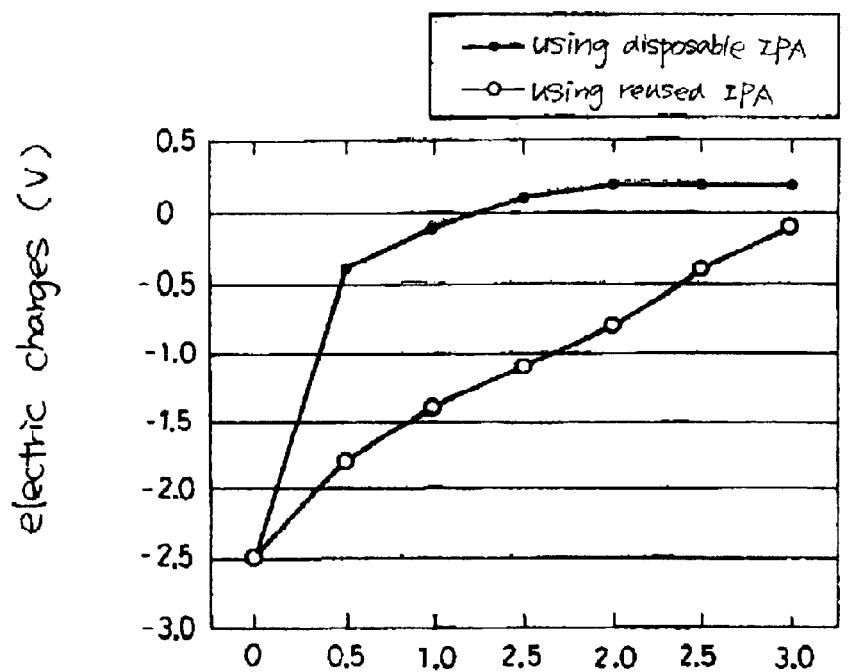
FIG. 18 is a graph using the IPA spray time to enter the horizontal axis and the electric charges of the wafer to enter the vertical axis to show the removal effect of electrical charges.

According the second test of example, samples are fabricated by different cleaning processes of each. Specifically, samples are cleaned by cleaning processes shown as Example No. 8 of Table 2. However, specific conditions of the cleaning processes shown as Example No. 8 are different from each other. Then, the efficiency of cleaning processes of each sample is evaluated. FIG. 18 is a graph using the IPA spray time to enter the horizontal axis and the electric charges of the wafer to enter the vertical axis to show the removal effect of electrical charges. The black circle (●) shows a result for cleaning processes with the IPA which was not in use and is discarded after being used. The white circle (○) shows a result for cleaning processes with the IPA which is reused as the circulatory system as described in Process (II). The plasma $SiO_2$ which is 0.1 µm in thickness covers the surface of the wafer. As shown in FIG. 18, the electric charges which are removed increase continuously with the IPA spray time. The electric charges are removed faster by cleaning process with the IPA which was not in use than by cleaning process with the IPA which is reused use as the circulatory system.

Figure 19:
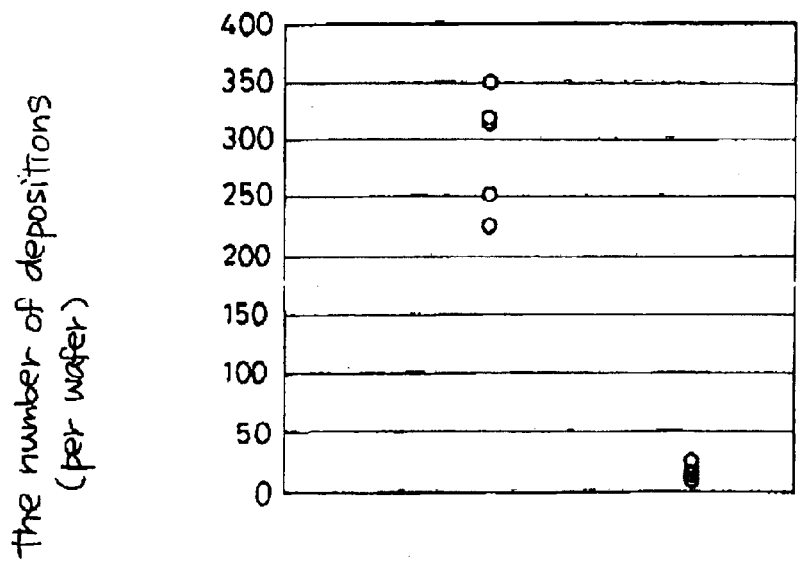
FIG. 19 is a graph using the presence or absence of the depositions shake off process (high speed shake off process) as shown in Process (III) of Table 3 to enter the horizontal axis and the number of the depositions per wafer to enter the vertical axis to show the efficiency of the depositions shake off process.

Further, FIG. 19 is a graph using the presence or absence of the depositions shake off process (high speed shake off process) as shown in Process (III) of Table 3 to enter the horizontal axis and the number of the depositions per wafer to enter the vertical axis to show the efficiency of the depositions shake off process. The number of measurements is n=5. As shown in FIG. 19, when the depositions shake off process is performed, the depositions on the surface of the wafer much decrease than when the depositions shake off process is not performed.

Figure 20:
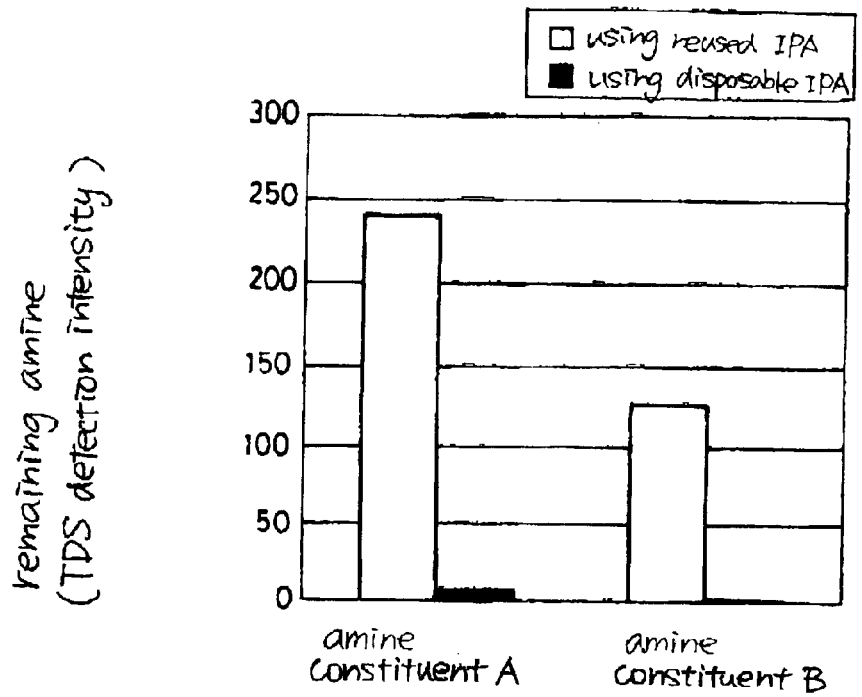
FIG. 20 is a graph using the IPA using method to enter the horizontal axis and the detection intensity of the remaining amine on the surface of the wafer by TDS (Thermal Desorption Spectroscopy) to shown the effect of the IPA using method on an amount of the remaining amine in Process (V) of Table 3.

FIG. 20 is a graph using the IPA using method to enter the horizontal axis and the detection intensity of the remaining amine on the surface of the wafer by TDS (Thermal Desorption Spectroscopy) to show the effect of the IPA using method on an amount of the remaining amine in Process (V) of Table 3. The black bar shows a result for the case of the IPA which is not used. In this case, the IPA which is once used is discarded. The white bar shows a result for the case of the reused IPA as the circulatory system as described in Process (II). The highest heating temperature is 1000 centigrade. As shown in FIG. 20, the remaining amine more decrease when the IPA which is not used is sprayed than when the reused IPA is sprayed as the circulatory system.

Figure 21:
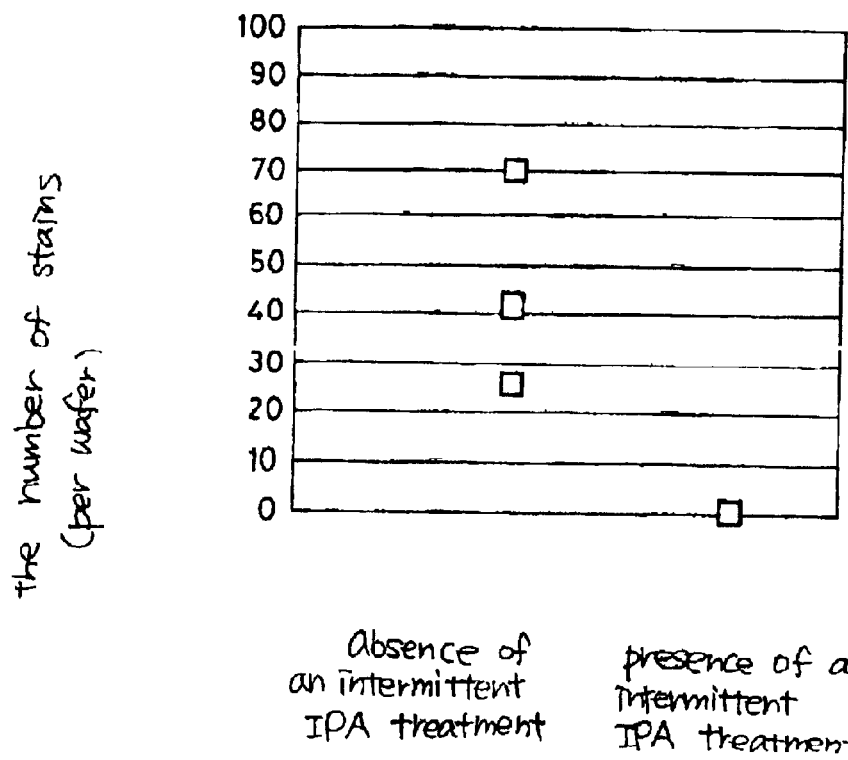
FIG. 21 is a graph using the presence or absence of the fine structures cleaning process (intermittent IPA treatment) as shown in Process (VI) of Table 3 to enter the horizontal axis and the number of stains per wafer after cleaning to show the efficiency of the fine structures cleaning process.
Figure 22:
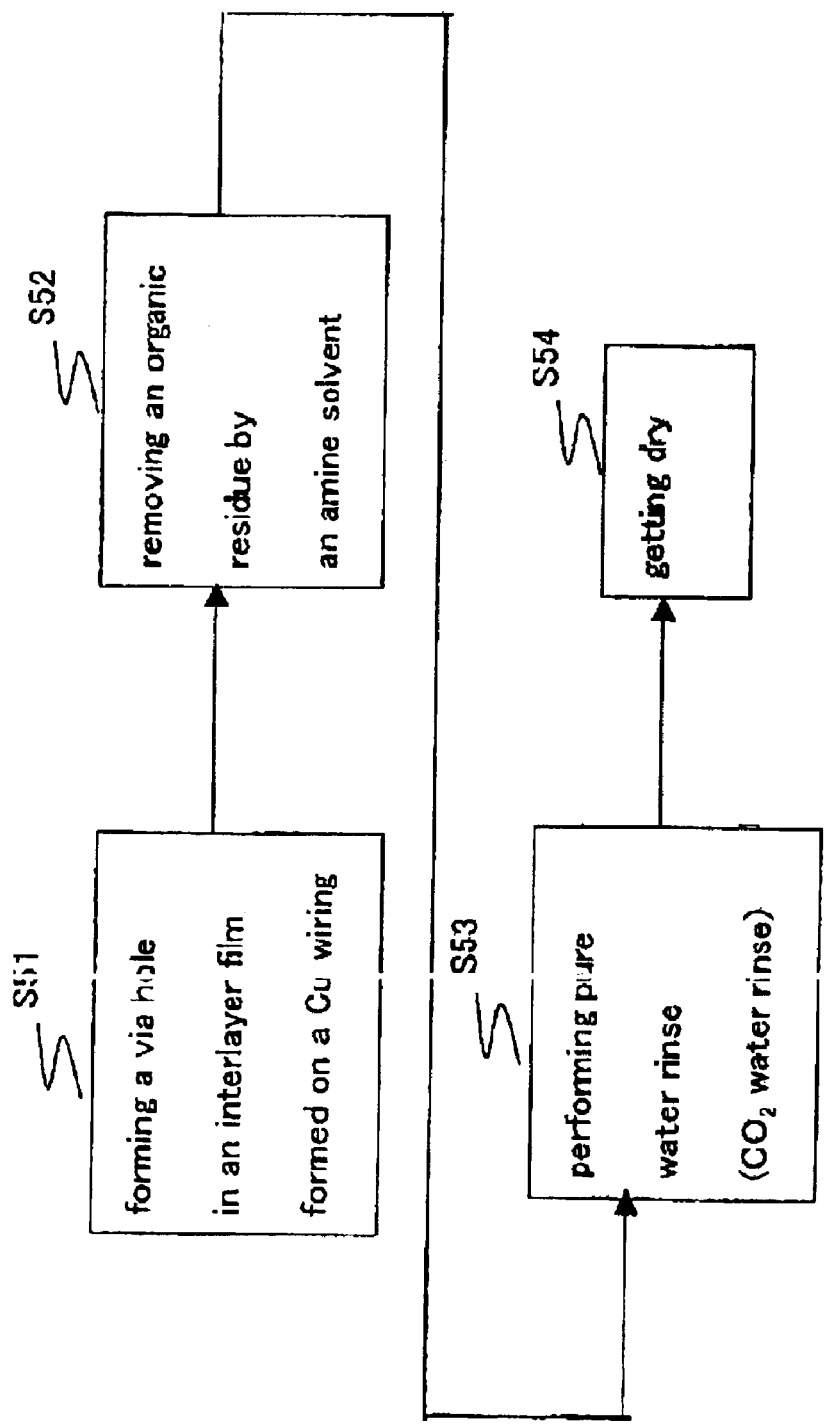
FIG. 22 is a flowchart showing a semiconductor device cleaning method with a related art organic release liquid.

FIG. 21 is a graph using the presence or absence of the fine structures cleaning process (intermittent IPA treatment) as shown in Process (VI) of Table 3 to enter the horizontal axis and the number of stains per wafer after cleaning to show the efficiency of the fine structures cleaning process. The number of measurements is n=3. As shown in FIG. 21, when the fine structures cleaning process (intermittent IPA treatment) is performed, the number of the stains on the surface of the wafer much decrease than when the fine structures cleaning process is not performed.

As described above in detail, according to the present invention, a semiconductor device fabricating method including a process for forming a wiring layer on a semiconductor substrate, followed by cleaning, can prevent elution and oxidation of the wiring layer.

The present invention is not limited to the above embodiments, and it is contemplated that numerous modifications may be made without departing from the spirit and scope of the invention. The method of fabricating a semiconductor device, as described above with reference to the figures, is a merely an exemplary embodiment of the invention, and the scope of the invention is not limited to these particular embodiments. For example, the specific layers and materials that are used to create the semiconductor devices of the non-limiting embodiments are merely examples, and one skilled in the art will readily know that the present invention can be applied to devices containing different layers and materials. Accordingly, other structural configurations may be used, without departing from the sprit and scope of the invention as defined in the claims.

It is noted that Applicants intent in the present specification and claims is to encompass equivalents of all claim elements, even if amended during prosecution.

What is claimed is:

1. A method of fabricating a semiconductor device on a semiconductor wafer, comprising:
    providing a via hole in an interlayer film covering a wiring layer, a part of said wiring layer being hereby exposed, wherein at least one of said via hole and said interlayer film is formed under a plasma atmosphere;
    cleaning said part of said wiring layer by using a first non-aqueous solvent;
    supplying a treating liquid to said semiconductor wafer to form an anticorrosive film on said part of said wiring layer, said treating liquid comprising an anticorrosive;
    cleaning, after said supplying a treating liquid, said semiconductor wafer by at least one of pure water and $CO_2$ gas-containing water; and
    burying a metal material into said via hole.

2. The method as claimed in claim 1, further comprising:
    cleaning said part of said wiring layer by using an organic releasing liquid after said cleaning said part of said wiring layer by using said first non-aqueous solvent.

3. The method as claimed in claim 2, further comprising:
    cleaning said part of said wiring layer by using a second non-aqueous solvent after said cleaning said part of said wiring layer by using said organic releasing liquid.

4. The method as claimed in claim 1, further comprising after said cleaning said semiconductor wafer by using said at least one of pure water and $CO_2$ gas-containing water:
    performing a heat treatment to said semiconductor wafer in a vacuum; and
    burying a said metal material into said via hole without breaking said vacuum.

5. The method as claimed in claim 1, wherein said semiconductor wafer comprises a silicon wafer, and said cleaning said part of said wiring layer by using said first non-aqueous solvent comprises jetting said first non-aqueous solvent to said silicon wafer while said silicon wafer revolves at a speed of more than 500 rpm.

6. The method as claimed in claim 5, wherein said speed is more than 1000 rpm.

7. The method as claimed in claim 5, wherein said cleaning said part of said wiring layer by using said first non-aqueous solvent comprises contacting said non-aqueous solvent to said part of said wiring layer so as to remove electric charges accumulated onto said interlayer film.

8. The method as claimed in claim 1, wherein said treating liquid further comprises a third non-aqueous solvent.

9. The method as claimed in claim 1, wherein said anticorrosive is one which is selected from a group comprising a benztriazole, a 1,2,3-tolyltriazole, a 1,2,4-tolyltriazole, a carboxybenztriazole, a 1-hydroxybenztriazole, a nitrobenztriazole, a 5-methyl-1H-benztriazole, a dihydroxypropylbenztriazole, a ureic anticorrosive, and a purine compound anticorrosive, and a mixture of more than two which are selected from said group.

10. The method as claimed in claim 9, wherein said treating liquid comprises an isopropyl alcohol, a benztriazole which is 0.5 to 30% by mass, an amine which is 0.0005 to 1% by mass, and a water which is 0.1 to 5% by mass, and said treating liquid is an alkalescent.

11. The method as claimed in claim 10, wherein said amine is one which is selected from a group comprising a 1-amino-2-propanol, a 2-amino-1-propanol, a 3-amino-1-propanol, a 2-methyl amino ethanol, a 2-amino-2-amino-2-methy-1-propanol, a 2-diethylaminoethanol, a monoethanol amine, a diethanol amine, a triethanol amine, a 2-(2-aminoethoxy)ethanol, a 2-(2aminoethylamino)ethanol, a 2-(diethylamino)ethanol, a 2-di(methylamine)ethanol, a choline, a morpholine, a diethylenetriamine, and a triethylenetetramine, and a mixture of more than two which are selected from said group.

12. The method as claimed in claim 1, wherein said providing said via hole in an interlayer film covering said wiring layer further comprises:
    forming a resist pattern on said interlayer film;
    etching said interlayer film selectively with using said resist pattern as a mask so as to form said via hole; and
    performing an ashing to remove said resist pattern.

13. The method as claimed in claim 1, wherein said wiring layer is isolated from said semiconductor wafer, and said wiring layer comprises a large-area wiring region and a drawing wiring region, and
    wherein an exposed area in said via hole reaching said large-area wiring region is larger than an exposed area in said via hole reaching said drawn wiring region.

14. The method as claimed in claim 13, wherein said exposed area in said via hole reaching said large-area wiring region is almost 100 times as large as said exposed area in said via hole reaching said drawing wiring region.

15. The method as claimed in claim 13, wherein a number of said via hole reaching said large-area wiring region is more than 1000, and a number of said via hole reaching said large area wiring region is more than 100 times as much as a number of said via hole reaching said drawing wiring region.

16. The method as claimed in claim 1, wherein said wiring layer is made of at least one which is selected from a group comprising a copper, a silver, a copper alloy and a silver alloy.

17. The method as claimed in claim 1, wherein said non-aqueous solvent comprises an alcohol.

18. The method as claimed in claim 17, wherein said non-aqueous solvent is one which is selected from a group comprising an isopropyl alcohol, an isobutyl alcohol, an isopentyl alcohol, an ethyl ether, an ethylene glycol monoethyl ether, a propanol, a 1-butanol, a 2-butanol, a methanol, a methyl isobutyl ketone, and a methyl ethyl ketone, and a mixture of more than two which are selected from said group.

19. A method of fabricating a semiconductor device on a semiconductor wafer, comprising:

providing a via hole in an interlayer film covering a wiring layer, a part of said wiring layer being hereby exposed, wherein said at least one of said via hole and said interlayer film is formed under a plasma atmosphere;

cleaning said part of said wiring layer by using a first non-aqueous solvent; and burying a metal material in said via hole, said semiconductor wafer being free from being subjected to water cleaning at least until said via hole is buried with said metal material.

20. The method as claimed in claim 19, further comprising:

cleaning said part of said wiring layer by using an organic releasing liquid after said cleaning said part of said wiring layer by using said first non-aqueous solvent.

21. The method as claimed in claim 19, wherein said first non-aqueous solvent comprises an alcohol.

22. The method as claimed in claim 21, wherein said first non-aqueous solvent is one which is selected from a group comprising an isopropyl alcohol, an isobutyl alcohol, an isopentyl alcohol, an ethyl ether, an ethylene glycol monoethyl ether, a propanol, a 1-butanol, a 2-butanol, a methanol, a methyl isobutyl ketone, and a methyl ethyl ketone, and a mixture of more than two which are selected from said group.

23. The method as claimed in claim 20, further comprising:

cleaning said part of said wiring layer by using a second non-aqueous solvent after cleaning said part of said wiring layer by using said organic releasing liquid.

24. The method as claimed in claim 23, wherein said non-aqueous solvent comprises an alcohol.

25. The method as claimed in claim 24, wherein said second non-aqueous solvent is one which is selected from a group comprising an isopropyl alcohol, an isobutyl alcohol, an isopentyl alcohol, an ethyl ether, an ethylene glycol monoethyl ether, a propanol, a 1-butanol, a 2-butanol, a methanol, a methyl isobutyl ketone, and a methyl ethyl ketone, and a mixture of more than two which are selected from said group.

26. The method as claimed in claim 19, further comprising:

cleaning said part of said wiring layer by using an organic releasing liquid before said cleaning said part of said wiring layer by using said first non-aqueous solvent.

27. The method as claimed in claim 26, wherein said cleaning part of said wiring layer by using said non-aqueous solvent comprises jetting said non-aqueous solvent to said semiconductor wafer, jetting an air to said semiconductor layer, and repeating said jetting said non-aqueous solvent and said jetting said air.

* * * * *